United States Patent
Ko et al.

(10) Patent No.: US 10,614,889 B2
(45) Date of Patent: Apr. 7, 2020

(54) NONVOLATILE MEMORY DEVICE AND METHOD OF PERFORMING AN ERASE OPERATION IN THE SAME

(71) Applicant: SAMSUNG ELECTRONICS CO., LTD., Suwon-si (KR)

(72) Inventors: Kui-Han Ko, Seoul (KR); Jin-Young Kim, Seoul (KR); Bong-Soon Lim, Seoul (KR); Il-Han Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/176,117

(22) Filed: Oct. 31, 2018

(65) Prior Publication Data

US 2019/0221267 A1 Jul. 18, 2019

(30) Foreign Application Priority Data

Jan. 16, 2018 (KR) .................. 10-2018-0005523

(51) Int. Cl.
*G11C 16/16* (2006.01)
*G11C 16/04* (2006.01)
*H01L 27/1157* (2017.01)
*H01L 27/11582* (2017.01)
*H01L 27/11556* (2017.01)

(52) U.S. Cl.
CPC .......... *G11C 16/16* (2013.01); *G11C 16/0483* (2013.01); *H01L 27/1157* (2013.01); *H01L 27/11582* (2013.01); *H01L 27/11556* (2013.01)

(58) Field of Classification Search
CPC ................ G11C 16/16; G11C 16/0483; H01L 27/11556
See application file for complete search history.

(56) References Cited

U.S. PATENT DOCUMENTS

| | | | |
|---|---|---|---|
| 6,771,536 B2 | 8/2004 | Li et al. | |
| 8,976,591 B2 | 3/2015 | Nam et al. | |
| 9,159,431 B2 | 10/2015 | Maeda | |
| 9,263,144 B2 | 2/2016 | Ito et al. | |
| 9,589,660 B1 | 3/2017 | Hashimoto et al. | |
| 2016/0284419 A1* | 9/2016 | Shim .................. | G11C 16/0483 |
| 2017/0117049 A1 | 4/2017 | Rajwade et al. | |
| 2017/0221565 A1 | 8/2017 | Ghodsi | |
| 2019/0147959 A1* | 5/2019 | Hsu ........................ | G11C 16/10 |
| | | | 365/185.12 |
| 2019/0189221 A1* | 6/2019 | Kim ..................... | G11C 7/1057 |

* cited by examiner

*Primary Examiner* — Gene N Auduong
(74) *Attorney, Agent, or Firm* — Sughrue Mion, PLLC

(57) ABSTRACT

An erase voltage is applied to channels of a selected string group to erase only the selected string group. A size and a number of the spare blocks for storing meta data are reduced and thus a size of the nonvolatile memory device is reduced by reducing unit capacity of the erase operation through grouping of the cell strings. Lifetime of the nonvolatile memory device is extended by having control over erasing some cell strings and not others. Control of cell strings for erasure includes allowing some control lines to float, in some embodiments. In some embodiments, ground select transistors with different thresholds and appropriately applied voltages are used to control erasure of particular cell strings. In some embodiments, biasing of word lines is applied differently to portions of a particular cell string to only erase a portion of the particular cell string.

20 Claims, 29 Drawing Sheets

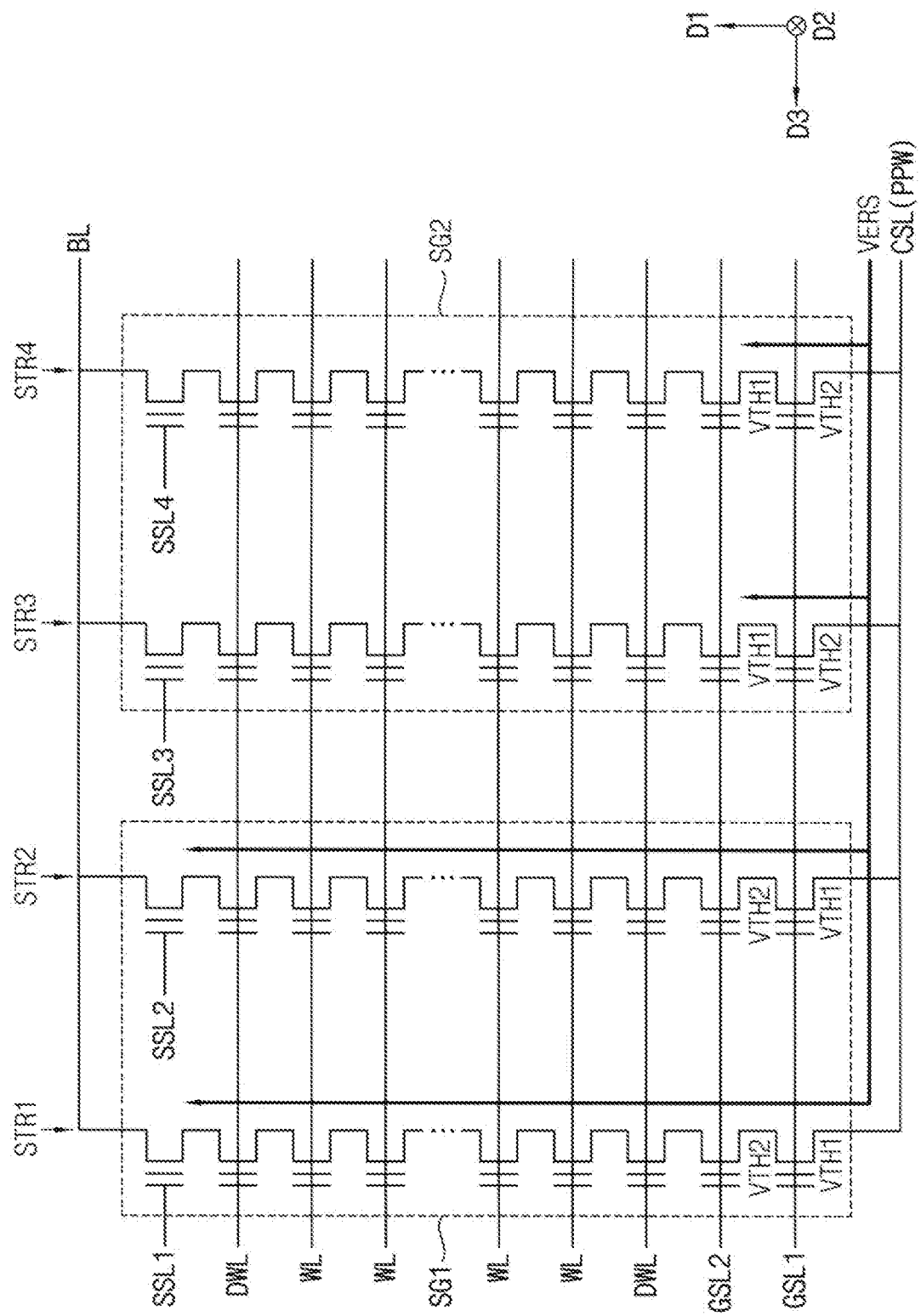

NONVOLATILE MEMORY DEVICE AND METHOD OF PERFORMING AN ERASE OPERATION IN THE SAME

CROSS-REFERENCE TO RELATED APPLICATION

This U.S. Non-provisional application claims priority under 35 USC § 119 to Korean Patent Application No. 10-2018-0005523, filed on Jan. 16, 2018, in the Korean Intellectual Property Office (KIPO), the disclosure of which is incorporated by reference in its entirety herein.

BACKGROUND

1. Technical Field

Example embodiments relate generally to semiconductor integrated circuits, and more particularly to a nonvolatile memory device and a method of performing an erase operation in a nonvolatile memory device.

2. Discussion of the Related Art

Nonvolatile memory devices may maintain stored data even though power is off. While volatile memory devices are widely used as main memories of various apparatuses, nonvolatile memory devices are widely used for storing program codes and/or data in various electronic devices, such as computers, mobile devices, etc. Recently, nonvolatile memory devices of three-dimensional structure such as a vertical NAND memory device have been developed to increase integration degree and memory capacity of the nonvolatile memory devices. According to the increase in the integration degree and memory capacity, unit capacity of an erase operation corresponding to the minimum number of the simultaneously-erased memory cells is increasing.

SUMMARY

Some example embodiments may provide a nonvolatile memory device and a method of performing an erase operation capable of reducing unit capacity of the erase operation.

According to example embodiments, in a method of performing an erase operation in a nonvolatile memory device, a plurality of cell strings in a memory block are divided into a plurality of string groups and an erase voltage is applied selectively to channels of a selected string group corresponding to an erase address among the plurality of cells strings to erase only the selected string group.

A cell string is a collection of memory cells. In some embodiments, a memory cell is a NAND memory cell. A memory cell may be similar to a transistor. For example, a memory cell may include a source, a gate, a drain and be built on a substrate. The region between the source and the gate may be referred to as the channel. The gate may include a control gate and a floating gate. In general, the control gate may be referred to as the gate of the memory cell. The state of the floating gate determines whether the memory cell has been programmed. The channel may be referred to as the substrate. The substrate local to a given cell string may be referred to as a well in the semiconductor substrate. In some embodiments, by controlling voltages local to a well of a given cell string, the given cell string is erased while cell strings associated with other wells are not erased. Thus, a time required for erasing is improved.

Also, with respect to a memory cell, a portion of the substrate proximate to the gate, the floating gate, the source and the drain may be referred to as a channel of the memory cell. The collection of channels of a cell string may be referred to as the channel of the cell string or as the channels of the cell string.

According to example embodiments, in a method of performing an erase operation in a nonvolatile memory device, a plurality of cell strings in a memory block is divided into a plurality of string groups, an erase voltage is applied to at least one of a common source line and bit lines of the plurality of cell strings and channels of a selected string group corresponding to an erase address among the plurality of cells strings are electrically connected to the at least one of the common source line and the bit lines to erase only the selected string group.

According to example embodiments, a nonvolatile memory device includes a memory block and a control circuit. The memory block includes a plurality of cell strings, a plurality of memory cells are disposed in a vertical direction in each of the plurality of cell string, and the plurality of cell strings are divided into a plurality of string groups. The control circuit selectively applies an erase voltage to channels of a selected string group corresponding to an erase address among the plurality of cells strings to erase only the selected string group.

A method of performing an erase operation in a nonvolatile memory device is provided herein. The nonvolatile memory device includes a memory block, the memory block including a plurality of cell strings, the plurality of cell strings comprising a first string group and a second string group, the first string group comprising a first plurality of memory cells disposed in a vertical direction, the second string group comprising a second plurality of memory cells disposed in the vertical direction, wherein the first string group is associated with first channels and the second string group is associated with second channels. The method includes forming an erase address corresponding to the first string group; and only applying, based on the erase address, an erase voltage to at least a portion of the first channels and not applying the erase voltage to the second channels. In some embodiments, the only applying, based on the erase address, an erase voltage to at least a portion of the first channels and not applying the erase voltage to the second channels includes applying the erase voltage to a common source line of the plurality of cell strings; turning on first ground selection transistors of the first string group while applying the erase voltage to the common source line; and turning off second ground selection transistors of the second string group.

In some embodiments, the only applying, based on the erase address, an erase voltage to at least a portion of the first channels and not applying the erase voltage to the second channels includes applying the erase voltage to bit lines of the plurality of cell strings; turning on first string selection transistors of the first string group while applying the erase voltage to the bit lines; and turning off second string selection transistors of the second string group.

In some embodiments, the only applying, based on the erase address, an erase voltage to at least a portion of the first channels and not applying the erase voltage to the second channels includes applying the erase voltage to a common source line of the plurality of cell strings; applying the erase voltage to bit lines of the plurality of cell strings; turning on first ground selection transistors of the first string group; turning on first string selection transistors of the first string group; turning off second ground selection transistors of the second string group; and turning off second string selection transistors of the second string group.

In some embodiments, the turning on first ground selection transistors comprises applying a first control signal to first ground selection lines in a gate layer, wherein the gate layer includes first ground selection transistors; and wherein the first ground selection lines are coupled to first gate electrodes of the first ground selection transistors.

In some embodiments, the only applying, based on the erase address, an erase voltage to at least a portion of the first channels and not applying the erase voltage to the second channels includes applying the erase voltage to a common source line of the plurality of cell strings; maintaining a first voltage of a first ground selection line corresponding to the first string group at a turn-on voltage lower than a reference voltage, the reference voltage corresponding to the erase voltage minus a threshold voltage of the first ground selection transistors; and maintaining a second voltage of a second ground selection line corresponding to the second string group at a turn-off voltage higher than the reference voltage.

In some embodiments, the first ground selection line is floated after a reference delay time is elapsed from a time point when applying the erase voltage to the common source line, and the second ground selection line is floated before the reference delay time is elapsed.

In some embodiments, the turn-on voltage is applied to the first ground selection line as a bias voltage while applying the erase voltage to the common source line, and the turn-off voltage is applied to the second ground selection line as a bias voltage while applying the erase voltage to the common source line.

In some embodiments, the only applying, based on the erase address, an erase voltage to at least a portion of the first channels and not applying the erase voltage to the second channels includes: applying a turn-on voltage VGON lower than a reference voltage VREF to a first gate electrode of a first ground selection transistor of the first string group, wherein VREF is equal to the erase voltage minus a transistor threshold voltage; and applying a turn-on voltage VGOFF higher than a reference voltage VREF to a second gate electrode of a second ground selection transistor of the second string group.

In some embodiments, the only applying, based on the erase address, an erase voltage to at least a portion of the first channels and not applying the erase voltage to the second channels comprises: applying VGON after applying VGOFF.

In some embodiments, the first string group comprises a plurality of sub blocks disposed in the vertical direction, and the memory block includes a plurality of intermediate switching transistors disposed in a boundary layer between the plurality of sub blocks.

In some embodiments, the method includes selectively switching the plurality of intermediate switching transistors by units of string groups based on the erase address and an end of the memory block from which the erase voltage is applied; and
selectively erasing one of a first group segment of the first string group under the boundary layer and a second group segment of the first string group over the boundary layer based on the erase address.

In some embodiments, the selectively switching the plurality of intermediate switching transistors includes: turning off the intermediate switching transistors of the first string group when the erase voltage is applied to a common source line of the plurality of cell strings and only the first group segment of the first string group is erased; and turning on the intermediate switching transistors of the first string group when the erase voltage is applied to the common source line and the second group segment of the first string group is erased.

In some embodiments, the selectively switching the plurality of intermediate switching transistors includes turning on the intermediate switching transistors of the first string group when the erase voltage is applied to bit lines of the plurality of cell strings and the first group segment of the first string group is erased; and turning off the intermediate switching transistors of the first string group when the erase voltage is applied to the bit lines and only the second group segment of the first string group is erased.

In some embodiments, the selectively switching the plurality of intermediate switching transistors comprises turning off all of the intermediate switching transistors of the plurality of cell strings when the erase voltage is applied to a common source line and bit lines of the plurality of cell strings and only one of the first group segment of the first string group and the second group segment of the first string group.

In some embodiments, the only applying, based on the erase address, an erase voltage to at least a portion of the first channels and not applying the erase voltage to the second channels includes when erasing only the first group segment of the first string group: i) turning on a first ground selection transistor of the first string group and turning off a second selected string selection transistor of the first string group, ii) applying a turn-off voltage to an intermediate switching line positioned between the first string group and the second string group, and iii) applying the erase voltage to the common source line and the bit lines.

In some embodiments, the only applying, based on the erase address, an erase voltage to at least a portion of the first channels and not applying the erase voltage to the second channels includes when erasing only the second group segment of the first string group: i) turning off a first ground selection transistor of the first string group and turning on a first string selection transistor of the first string group, ii) applying a turn-off voltage to an intermediate switching line positioned between the first string group and the second string group, and iii) applying the erase voltage to the common source line and the bit lines.

In some embodiments, an erase permission voltage is applied to word lines of a selected group segment to be erased among the first and second group segments and an erase inhibition voltage is applied to word lines of an unselected group segment.

In additional embodiments of the method, the applying the erase voltage to at least a portion of the first channels comprises applying a turn-on voltage VGON lower than a reference voltage VREF to a first gate electrode of a first ground selection transistor of the first string group, wherein VREF is equal to the erase voltage minus a transistor threshold voltage; and applying a turn-on voltage VGOFF higher than a reference voltage VREF to a second gate electrode of a second ground selection transistor of the second string group. Also, in some embodiments, applying the erase voltage to at least a portion of the first channels comprises applying VGON after applying VGOFF.

In another embodiment of the method, the first string group comprises a plurality of sub blocks disposed in the vertical direction; and the memory block comprises a plurality of intermediate switching transistors disposed in a boundary layer between the plurality of sub blocks. In addition, in some embodiments, the method includes selectively switching the plurality of intermediate switching transistors by units of string groups based on the erase address and an end of the memory block from which the erase voltage is applied; and selectively erasing one of a first group segment of the first string group under the boundary layer and a second group segment of the first string group over the boundary layer based on the erase address. Also, in some embodiments, the selectively switching the plurality of intermediate switching transistors comprises: turning off the intermediate switching transistors of the first string group when the erase voltage is applied to a common source line of the plurality of cell strings and only the first group segment of the first string group is erased; and turning on the intermediate switching transistors of the first string group when the erase voltage is applied to the common source line and the second group segment of the first string group is erased.

In some embodiments, the selectively switching the plurality of intermediate switching transistors comprises: turning on the intermediate switching transistors of the first string group when the erase voltage is applied to bit lines of the plurality of cell strings and the first group segment of the first string group is erased; and turning off the intermediate switching transistors of the first string group when the erase voltage is applied to the bit lines and only the second group segment of the first string group is erased. Also, in some embodiments, the selectively switching the plurality of intermediate switching transistors comprises: turning off all of the intermediate switching transistors of the plurality of cell strings when the erase voltage is applied to a common source line and bit lines of the plurality of cell strings and only one of the first group segment of the first string group and the second group segment of the first string group. In addition, in some embodiments, the applying the erase voltage to at least a portion of the first channels comprises: when erasing only the first group segment of the first string group: i) turning on a first ground selection transistor of the first string group and turning off a second selected string selection transistor of the first string group, ii) applying a turn-off voltage to an intermediate switching line positioned between the first string group and the second string group, and iii) applying the erase voltage to the common source line and the bit lines.

In other embodiments, the applying the erase voltage to at least a portion of the first channels includes: when erasing only the second group segment of the first string group: i) turning off a first ground selection transistor of the first string group and turning on a first string selection transistor of the first string group, ii) applying a turn-off voltage to an intermediate switching line positioned between the first string group and the second string group, and iii) applying the erase voltage to the common source line and the bit lines.

In some embodiments, an erase permission voltage is applied to word lines of a selected group segment to be erased among the first and second group segments and an erase inhibition voltage is applied to word lines of an unselected group segment.

This disclosure also provides a method of performing an erase operation in a nonvolatile memory device including one or more memory blocks, each memory block including a plurality of cell strings, a plurality of memory cells being disposed in a vertical direction in each cell string, the method including: applying an erase voltage to at least one of a common source line and of a bit line of a plurality of cell strings; and electrically connecting channels of a selected string group corresponding to an erase address among the plurality of cells strings to the at least one of the common source line and the bit lines to erase only the selected string group.

In addition, the disclosure provides a description of a nonvolatile memory device including: a memory block including a plurality of cell strings, a plurality of memory cells being disposed in a vertical direction in each of the plurality of cell string, the plurality of cell strings being divided into a plurality of string groups including a first string group comprising first channels and a second string group comprising second channels; and a control circuit configured to selectively apply an erase voltage to the first channels of the first string group corresponding to an erase address among the plurality of cell strings to erase the first string group while not erasing the second string group.

The disclosure also provides a method of erasing a first cell string of a flash memory, wherein the flash memory comprises the first cell string and a second cell string, the method including: holding a word line, WL, at a ground level, VERSWL; holding a first ground select line at a ground level from a first time to a second time, wherein the first ground select line is associated with the first cell string; floating a second ground select line beginning at the first time, wherein the second ground select line is associated with the second cell string; applying an erase voltage, VERS, to a common source line beginning at the first time, wherein the common source line is associated with the first cell string and associated with the second cell string; and floating the first ground select line after a second time, wherein the second time is after the first time.

Yet another method is provided including a method of erasing a first portion of a first cell string of a flash memory, wherein the flash memory comprises the first cell string and a second cell string, the method including: applying a turnoff voltage, VSOFF, to a first source selection line of the first cell string; applying VSOFF to a second source selection line of the second cell string; applying an erase permission voltage, VERSWL, to a first memory cell, wherein the first portion of the first cell string includes the first memory cell; applying an erase inhibition voltage, VINHWL, to a second memory cell, wherein a second portion of the first cell string includes the second memory cell; applying a turn-on voltage, VGON, to a first ground selection line associated with the first cell string; applying a turn-off voltage, VGOFF, to a second ground selection line associated with the second cell string, wherein VGOFF is applied in time before VGON; and applying an erase voltage, VERS, to a common source line, wherein the common source line is associated with the first cell string and associated with the second cell string, and wherein an effect of VERS is to erase the first memory cell while not erasing the second memory cell.

Finally, a method is provided of erasing a first cell string of a flash memory while not erasing a second cell string of the flash memory, the method including: applying a voltage VGON to a first ground selection line, wherein the first ground selection line is coupled to a first ground selection transistor characterized by a first threshold voltage, VTH1, at a bottom of the first cell string, and wherein the first ground selection line is coupled to a second ground selection transistor characterized by a second threshold voltage, VTH2, at a bottom of the second cell string, wherein VGON is configured to turn on the first ground selection transistor and to turn on the second ground selection transistor; applying a voltage VGOFF to a second ground selection line, wherein the second ground selection line is coupled to a third ground selection transistor characterized by VTH2 near the bottom of the first cell string, and wherein the second ground selection line is coupled to a fourth ground selection transistor characterized by VTH1 near the bottom of the second cell string, wherein VGOFF is configured to turn on the third ground selection transistor and to turn off the fourth ground selection transistor; and applying an erase voltage VERS to a common source line, wherein the common source line is coupled to a drain of the first ground selection transistor and coupled to a drain of the second ground selection transistor.

The nonvolatile memory device and the method of performing an erase operation according to example embodiments may reduce a size and a number of the spare blocks for storing meta data and thus reduce a size of the nonvolatile memory device by reducing unit capacity of the erase operation through grouping of the cell strings. In addition, lifetime of the nonvolatile memory device may be extended by suppressing unnecessary erase through grouping of the cell strings.

BRIEF DESCRIPTION OF THE DRAWINGS

Example embodiments of the present disclosure will be more clearly understood from the following detailed description taken in conjunction with the accompanying drawings.

FIGS. 11A-11B, 12A-12B and 13A-13B are diagrams illustrating a method of performing an erase operation in a nonvolatile memory device according to example embodiments.

DETAILED DESCRIPTION OF THE EMBODIMENTS

Figure 1:
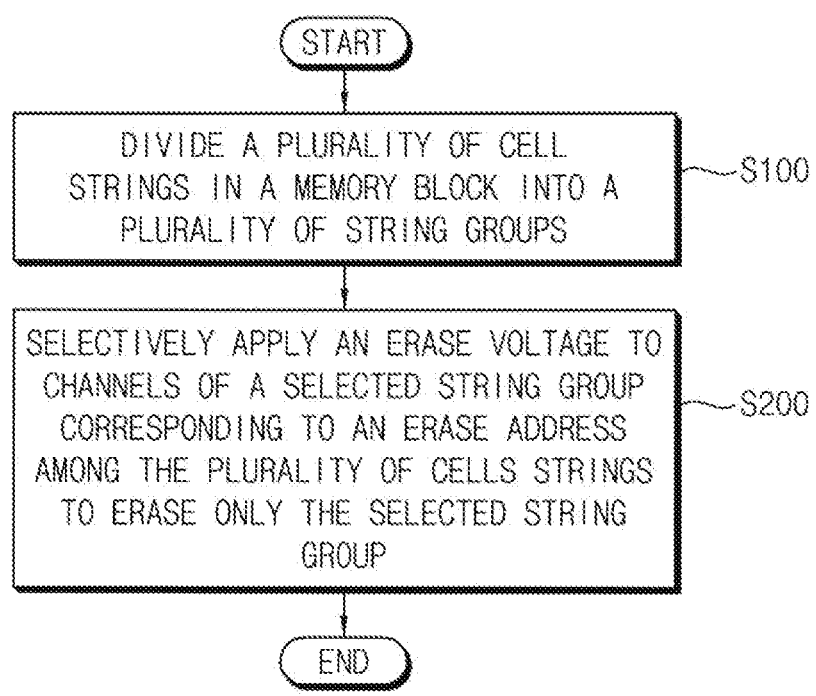
FIG. 1 is a flow chart illustrating a method of performing an erase operation in a nonvolatile memory device according to example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is a flow chart illustrating a method of performing an erase operation in a nonvolatile memory device according to example embodiments.

As will be described below with reference to FIGS. 2 through 6, a nonvolatile memory device may include at least one memory block, each memory block may include a plurality of cell strings and each cell string may include a plurality of memory cells that are disposed in a vertical direction.

Referring to FIG. 1, a plurality of cell strings in a memory block are divided into a plurality of string groups (S100). An erase voltage is selectively applied to channels of a selected string group corresponding to an erase address among the plurality of cells strings to erase only the selected string group (S200).

One memory block may be defined as a plurality of cell strings that are formed in a same well in a semiconductor substrate. The plurality of cell strings in the same memory block may be controlled by a same well bias voltage and a same source line voltage via a common source line. Grouping of cell strings according to example embodiments is differentiated from grouping of cell strings according to partitioning of wells.

In some example embodiments, as will be described below with reference to FIGS. 7 through 10, the plurality of cell strings in the memory block may be divided into the plurality of string groups by forming a plurality of ground selection lines in one gate layer in which ground selection transistors are formed and by connecting the plurality of ground selection lines to gate electrodes of the ground selection transistors respectively by units of string groups. In other example embodiments, as will be described below with reference to FIGS. 11A and 11B, the plurality of cell strings in the memory block may be divided into the plurality of string groups by grouping the string selection transistors into a plurality of control groups. In still other example embodiments, as will be described below with reference to FIGS. 13A and 13B, the plurality of cell strings in the memory block may be divided into the plurality of string groups by forming a plurality of ground selection lines respectively in a plurality of gate layers in which ground selection transistors are formed and by setting threshold voltages of the ground selection transistors differently.

As for a vertical NAND flash memory device, a size of a memory block is increasing according to the increase of the number of the stacked word lines and/or the number of the string selection lines and thus the unit capacity of the erase operation is increasing. The size of the spare blocks that is assigned by a predetermined ratio of the entire memory blocks is increased according to the increase of the size of the memory block and thus the size of the entire memory chip is increased. The increase of the unit capacity of the erase operation causes a problem that the other portion has to be erased even when data stored in only a portion of the unit capacity of the erase operation are required to be modified.

The nonvolatile memory device and the method of performing an erase operation according to example embodiments may reduce a size and a number of the spare blocks for storing meta data and thus reduce a size of the nonvolatile memory device by reducing unit capacity of the erase operation through grouping of the cell strings. In addition, lifetime of the nonvolatile memory device may be extended by suppressing unnecessary erase through grouping of the cell strings.

Figure 2:
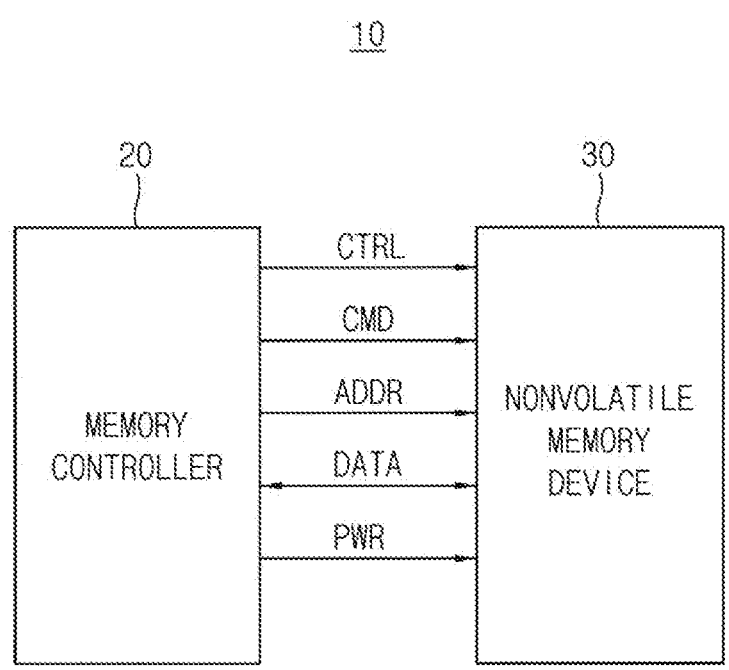
FIG. 2 is a block diagram illustrating a memory system according to example embodiments.

FIG. 2 is a block diagram illustrating a memory system according to example embodiments.

Referring to FIG. 2, a memory system 10 may include a memory controller 20 and a memory device 30. In general, there may be more than one memory device. Also, the memory device 30 may be a nonvolatile memory device.

The memory device 30 may be a nonvolatile memory device as described herein. The memory system 10 may include data storage media based on flash memory such as a memory card, a universal serial bus (USB) memory and solid state drive (SSD).

The memory device 30 may perform a read operation, an erase operation, and a program operation or a write operation under control of the memory controller 20. The memory device 30 receives a command CMD, an address ADDR and data DATA through input/output lines from the memory controller 20 for performing such operations. In addition, the memory device 30 receives a control signal CTRL through a control line from the memory controller 20. In addition, the memory device 30 receives a power PWR through a power line from the memory controller 20.

Figure 3:
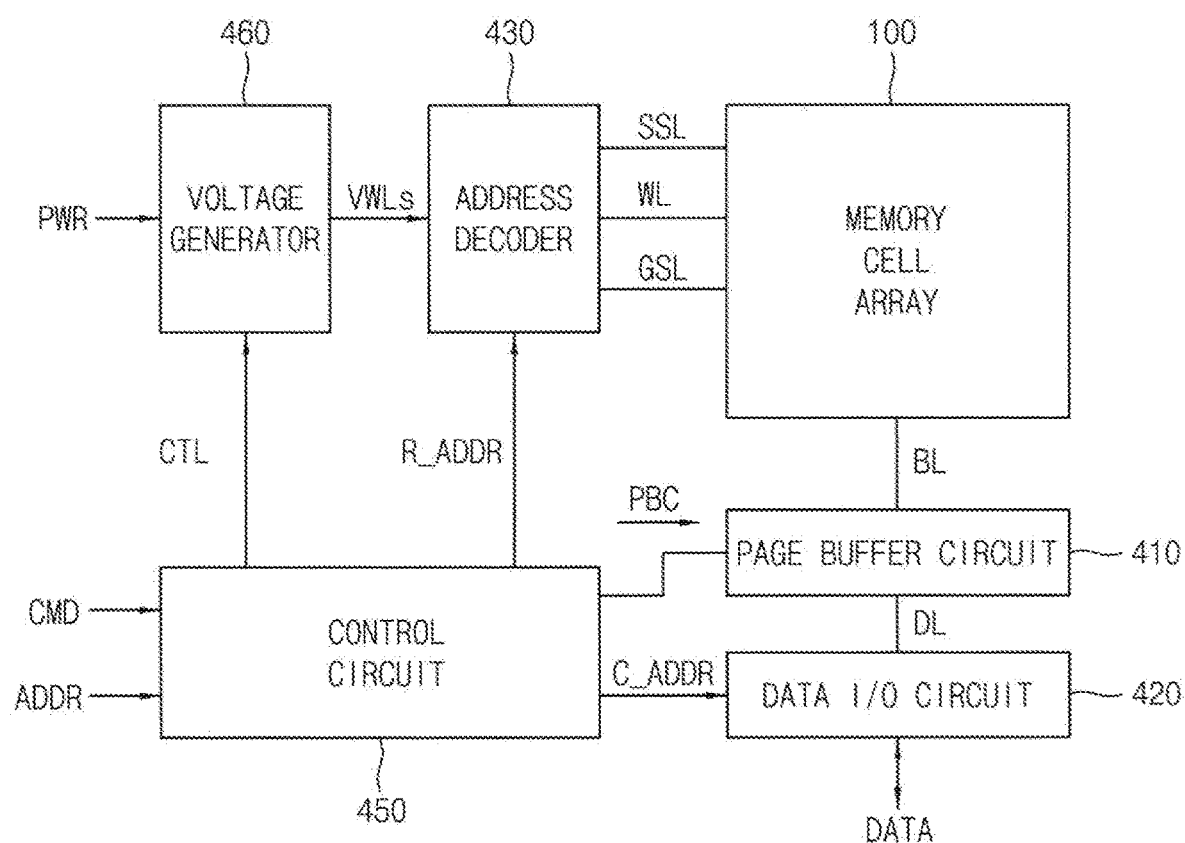
FIG. 3 is a block diagram illustrating an example embodiment of a nonvolatile memory device included in the memory system of FIG. 2.

FIG. 3 is a block diagram illustrating an example embodiment of a nonvolatile memory device included in the memory system of FIG. 2.

Referring to FIG. 3, the memory device 30 includes a memory cell array 100, a page buffer circuit 410, a data input/output circuit 420, an address decoder 430, a control circuit 450 and a voltage generator 460.

The memory cell array 100 may be coupled to the address decoder 430 through a plurality of string selection lines SSL, a plurality of word lines WL, and a plurality of ground selection lines GSL. In addition, the memory cell array 100 may be coupled to the page buffer circuit 410 through a plurality of bit lines BL. The memory cell array 100 may include a plurality of memory cells coupled to the plurality of word lines WL and the plurality of bit lines BL. In some example embodiments, the memory cell array 100 may be a three-dimensional memory cell array, which is formed on a substrate in a three-dimensional structure (or a vertical structure). In this case, the memory cell array 100 may include a plurality of cell strings, that is, a plurality of NAND strings that are vertically oriented such that at least one memory cell is located over another memory cell.

The control circuit 450 may receive a command (signal) CMD and an address (signal) ADDR from the memory controller 20 and control erasure, programming and read operations of the memory device 30 based on the command signal CMD and the address signal ADDR. An erasure operation may comprise performing a sequence of erase loops, and a program operation may include performing a sequence of program loops. Each program loop may include a program operation and a program verification operation. Each erase loop may include an erase operation and an erase verification operation. The read operation may include a normal read operation and data recover read operation.

For example, the control circuit 450 may generate the control signals CTL, which are used for controlling the voltage generator 460, and may generate the page buffer control signal PBC for controlling the page buffer circuit 410, based on the command signal CMD, and generate the row address R_ADDR and the column address C_ADDR based on the address signal ADDR. The control circuit 450 may provide the row address R_ADDR to the address decoder 430 and provide the column address C_ADDR to the data input/output circuit 420.

The address decoder 430 may be coupled to the memory cell array 100 through the plurality of string selection lines SSL, the plurality of word lines WL, and the plurality of ground selection lines GSL. During the program operation or the read operation, the address decoder 430 may determine one of the plurality of word lines WL as a selected word line and determine rest of the plurality of word lines WL except for the selected word line as unselected word lines based on the row address R_ADDR.

In addition, during the program operation or the read operation, the address decoder 430 may determine one of the plurality of string selection lines SSL as a selected string selection line and determine rest of the plurality of string selection lines SSL except for the selected string selection line as unselected string selection lines based on the row address R_ADDR.

The voltage generator 460 may generate word line voltages VWL, which are required for the operation of the memory cell array 100 of the memory device 30, based on the control signals CTL. The voltage generator 460 may receive the power PWR from the memory controller 20. The word line voltages VWL may be applied to the plurality of word lines WL through the address decoder 430.

For example, during the erase operation, the voltage generator 460 may apply an erase voltage to a well and or a common source line of a memory block and apply an erase permission voltage (e.g., a ground voltage) to all word lines of the memory block or a portion of the word lines based on an erase address. In addition, during the erase verification operation, the voltage generator 460 may apply an erase verification voltage simultaneously to all word lines of the memory block or sequentially to the word lines one by one.

For example, during the program operation, the voltage generator 460 may apply a program voltage to the selected word line and may apply a program pass voltage to the unselected word lines. In addition, during the program verification operation, the voltage generator 460 may apply a program verification voltage to the first word line and may apply a verification pass voltage to the unselected word lines.

In addition, during the normal read operation, the voltage generator 460 may apply a read voltage to the selected word line and may apply a read pass voltage to the unselected word lines. During the data recover read operation, the voltage generator 460 may apply the read voltage to a word line adjacent to the selected word line and may apply a recover read voltage to the selected word line.

The page buffer circuit 410 may be coupled to the memory cell array 100 through the plurality of bit lines BL. The page buffer circuit 410 may include a plurality of buffers. In some example embodiments, each buffer may be connected to only one bit line. In other example embodiments, each buffer may be connected to two or more bit lines. The page buffer circuit 410 may temporarily store data to be programmed in a selected page or data read out from the selected page of the memory cell array 100.

The data input/output circuit 420 may be coupled to the page buffer circuit 410 through data lines DL. During the program operation, the data input/output circuit 420 may receive program data DATA received from the memory controller 20 and provide the program data DATA to the page buffer circuit 410 based on the column address C_ADDR received from the control circuit 450. During the read operation, the data input/output circuit 420 may provide read data DATA, having been read from the memory cell array 100 and stored in the page buffer circuit 410, to the memory controller 20 based on the column address C_ADDR received from the control circuit 450.

In addition, the page buffer circuit 410 and the data input/output circuit 420 may read data from a first area of the memory cell array 100 and write this read data to a second area of the memory cell array 100 (e.g., without transmitting the data to a source external to the memory device 30, such as to the memory controller 20). That is, the page buffer circuit 410 and the data input/output circuit 420 may perform a copy-back operation.

Hereinafter, a first direction D1 indicates a direction perpendicular to an upper surface of a semiconductor substrate, and a second direction D2 and a third direction D3 indicate two directions parallel to the upper surface of the semiconductor substrate. For example, the second direction and the third direction D3 may be perpendicular to each other. The first direction D1 may be referred to as a vertical direction, the second direction D2 may be referred to as a row direction and the third direction D3 may be referred to as a column direction. The direction indicated by an arrow in figures and the opposite direction may be considered as the same direction.

Figure 4:
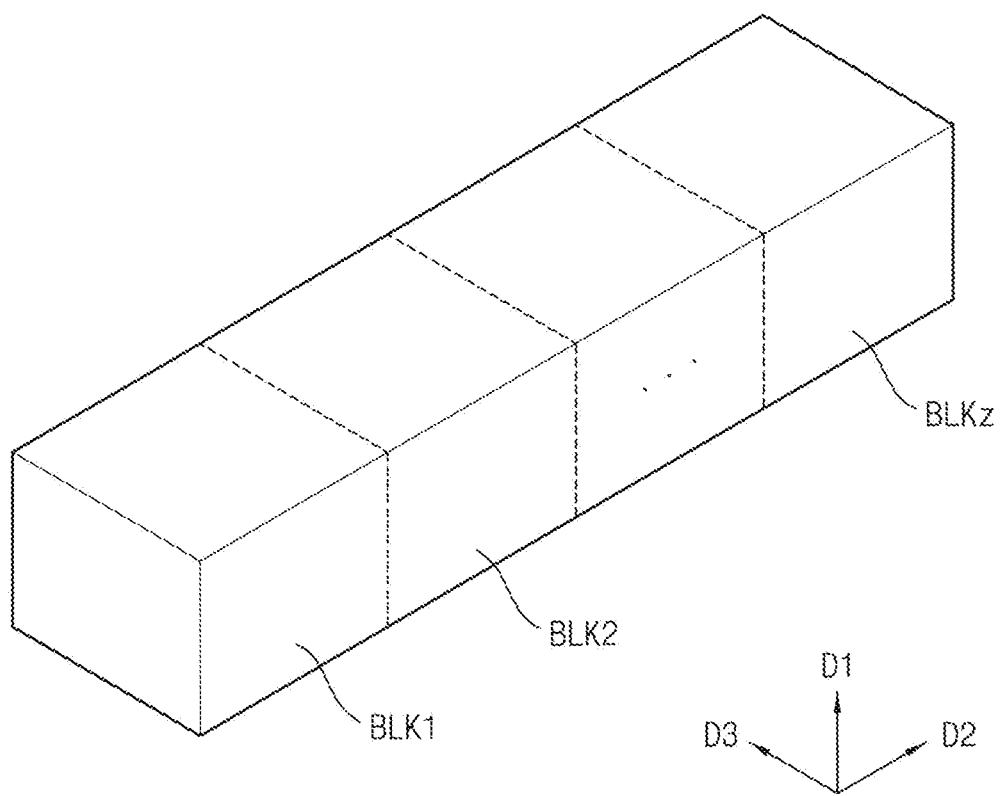
FIG. 4 is a block diagram illustrating a memory cell array included in the nonvolatile memory device of FIG. 3.
Figure 5:
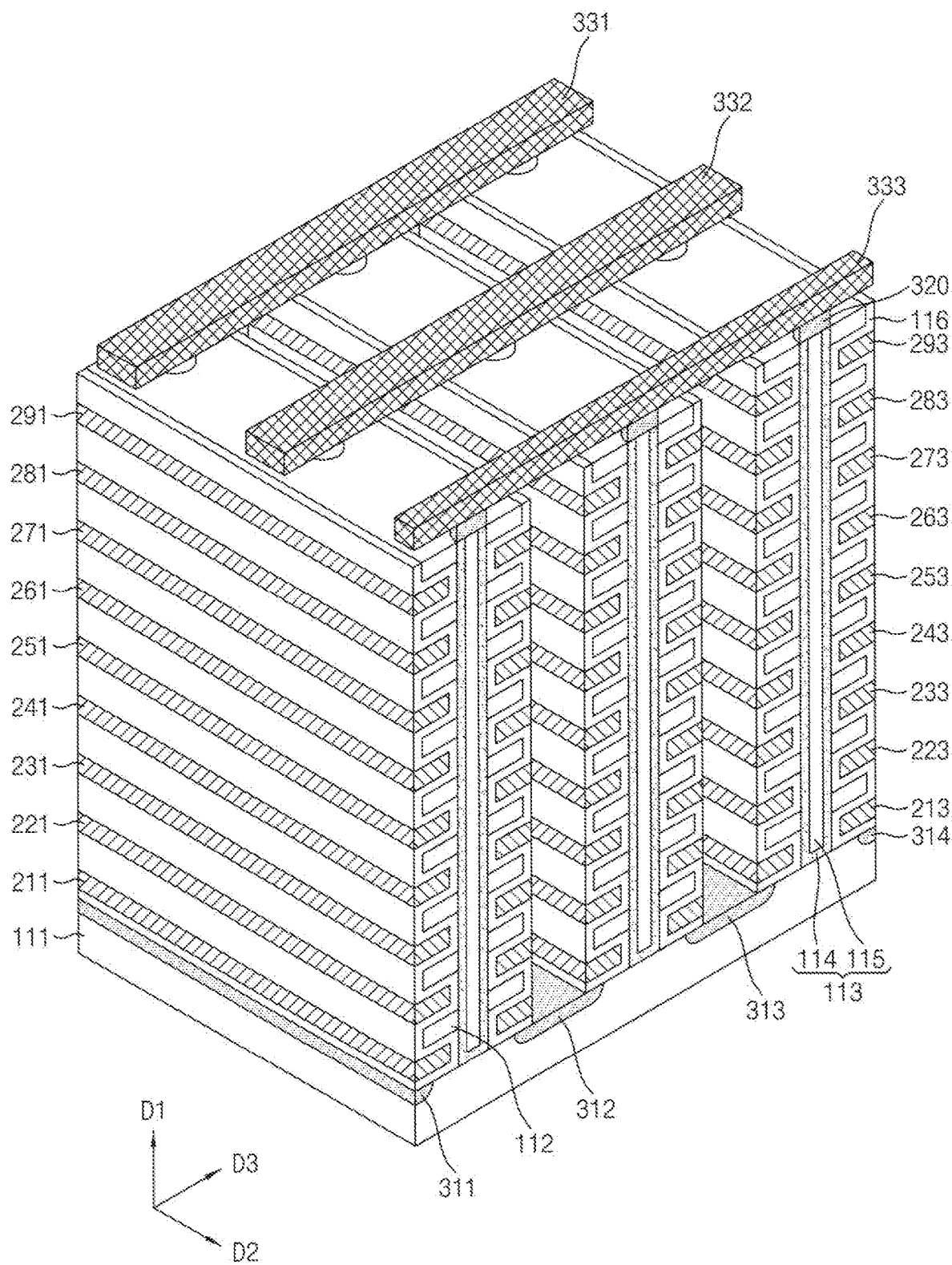
FIG. 5 is a perspective view illustrating one of memory blocks of FIG. 4.

FIG. 4 is a block diagram illustrating a memory cell array included in the nonvolatile memory device of FIG. 3, and FIG. 5 is a perspective view illustrating one of memory blocks of FIG. 4.

Referring to FIG. 4, the memory cell array 100 may include a plurality of memory blocks BLK1 to BLKz. In an embodiment, the memory blocks BLK1 to BLKz are selected by the address decoder 430 in FIG. 3. For example, the address decoder 430 may select a particular memory block BLK corresponding to a block address among the memory blocks BLK1 to BLKz.

Referring to FIG. 5, a memory block BLKi includes NAND strings which are formed on a substrate in a three-dimensional structure (or a vertical structure). The memory block BLKi includes structures extending along the first, second and third directions D1, D2 and D3.

A substrate 111 is provided. For example, the substrate 111 may have a well of a first type (e.g., a first conductive type). For example, the substrate 111 may have a p-well formed by implanting a group 3 element such as boron (B). For example, the substrate 111 may have a pocket p-well provided in an n-well. In an embodiment, the substrate 111 has a p-type well (or a p-type pocket well). However, the conductive type of the substrate 111 is not limited to the p-type.

A plurality of doping regions 311 to 314 extending along the first direction D1 are provided in/on the substrate 111. For example, the plurality of doping regions 311 to 314 may have a second type (e.g., a second conductive type) different from the first type of the substrate 111. In an embodiment, the first to fourth doping regions 311 to 314 have an n-type. However, the conductive type of the first to fourth doping regions 311 to 314 is not limited to the n-type.

A plurality of insulation materials 112 extending along the first direction D1 are sequentially provided along the second direction D2 on a region of the substrate 111 between the first and second doping regions 311 and 312. For example, the plurality of insulation materials 112 are provided along the second direction D2, being spaced by a specific distance. For example, the insulation materials 112 may include an insulation material such as an oxide layer.

A plurality of pillars 113 penetrating the insulation materials along the second direction D2 are sequentially disposed along the first direction D1 on a region of the substrate 111 between the first and second doping regions 311 and 312. For example, the plurality of pillars 113 penetrate the insulation materials 112 to contact the substrate 111.

For example, a pillar of the pillars 113 may include a plurality of materials. For example, a channel layer 114 of a pillar of the pillars 113 may include a silicon material having a first type. For example, the channel layer 114 of a pillar of the pillars 113 may include a silicon material having the same type as the substrate 111. In an embodiment, the channel layer 114 of a pillar of the pillars 113 includes a p-type silicon. However, the channel layer 114 of the pillars 113 are not limited to the p-type silicon.

An internal material 115 of the pillars 113 include an insulation material. For example, the internal material 115 of a pillar of the pillars 113 may include an insulation material such as a silicon oxide. In some examples, the internal material 115 of a pillar of the pillars 113 may include an air gap.

An insulation layer 116 is provided along the exposed surfaces of the insulation materials 112, the pillars 113, and the substrate 111, on a region between the first and second doping regions 311 and 312.

The plurality of first conductive materials 211 to 291 are provided on surfaces of the insulation layer 116, in a region between the first and second doping regions 311 and 312. For example, the first conductive material 211 extending along the second direction D2 is provided between the insulation materials 112 adjacent to the substrate 111 and the substrate 111. In more detail, the first conductive material 211 extending along the second direction D2 is provided between the insulation layer 116 at the bottom of the insulation materials 112 adjacent to the substrate 111 and the substrate 111.

A first conductive material extending along the second direction D2 is provided between the insulation layer 116 at the top of the specific insulation material among the insulation materials 112 and the insulation layer 116 at the bottom of a specific insulation material among the insulation materials 112. For example, a plurality of first conductive materials 221 to 281 extending along the second direction D2 are provided between the insulation materials 112 and it may be understood that the insulation layer 116 is provided between the insulation materials 112 and the first conductive materials 221 to 281. The first conductive materials 211 to 291 may be formed of a conductive metal. In some examples, the first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, provided are a plurality of insulation materials 112 extending along the second direction D2, a plurality of pillars 113 disposed sequentially along the second direction D2 and penetrating the plurality of insulation materials 112 along the first direction D1, an insulation layer 116 provided on the exposed surfaces of the plurality of insulation materials 112 and the plurality of pillars 113, and a plurality of conductive materials 213 to 293 extending along the second direction D2.

Drains 320 are provided on the plurality of pillars 113, respectively. On the drains, the second conductive materials 331 to 333 extending along the third direction D3 are provided. The second conductive materials 331 to 333 are disposed along the second direction D2, being spaced by a specific distance. The second conductive materials 331 to 333 are respectively connected to the drains 320 in a corresponding region. The drains 320 and the second conductive material 333 extending along the third direction D3 may be connected through each contact plug. The second conductive materials 331 to 333 may include metal materials. The second conductive materials 331 to 333 may include conductive materials such as a polysilicon.

The layers in which the first conductive materials are formed correspond to gate layers and the first conductive materials may form gate lines such as a string selection line SSL, a word line WL, an intermediate switching line MSL, a ground selection line GSL, etc. The second conductive materials may form a bit line BL.

Figure 6:
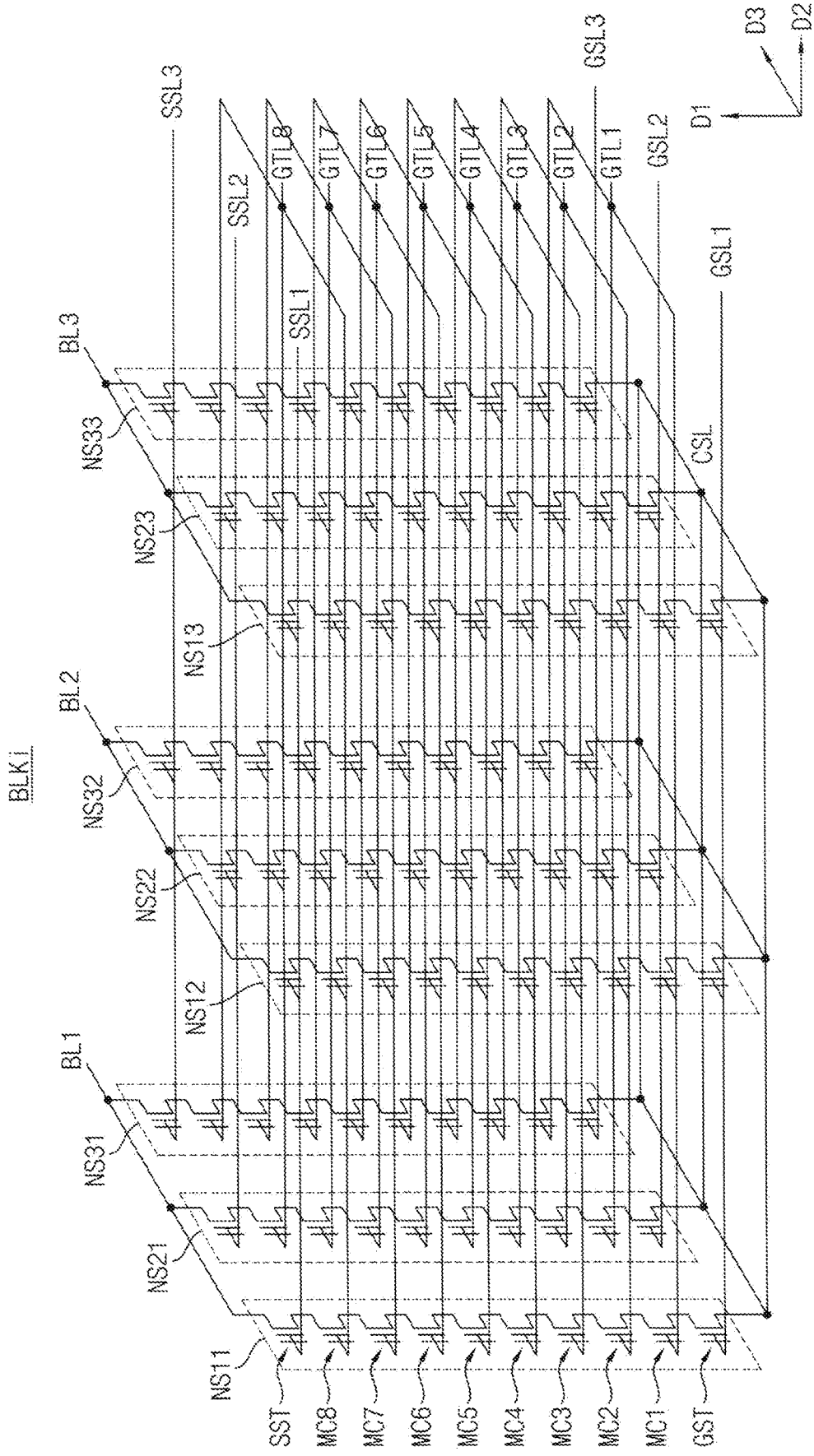
FIG. 6 is a circuit diagram illustrating an equivalent circuit of the memory block described with reference to FIG. 5.

FIG. 6 is a circuit diagram illustrating an equivalent circuit of the memory block described with reference to FIG. 5.

The memory block BLKi of FIG. 6 may be formed on a substrate in a three-dimensional structure (or a vertical structure). For example, a plurality of NAND strings or cell strings included in the memory block BLKi may be formed in the first direction D1 perpendicular to the upper surface of the substrate.

Referring to FIG. 6, the memory block BLKi may include NAND strings NS11 to NS33 coupled between bit lines BL1, BL2 and BL3 and a common source line CSL. Each of the NAND strings NS11 to NS33 may include a string selection transistor SST, a plurality of memory cells MC1 to MC8, and a ground selection transistor GST. In FIG. 6, each of the NAND strings NS11 to NS33 is illustrated to include eight memory cells MC1 to MC8. However, example embodiments are not limited thereto. In some example embodiments, each of the NAND strings NS11 to NS33 may include any number of memory cells.

Figure 14:
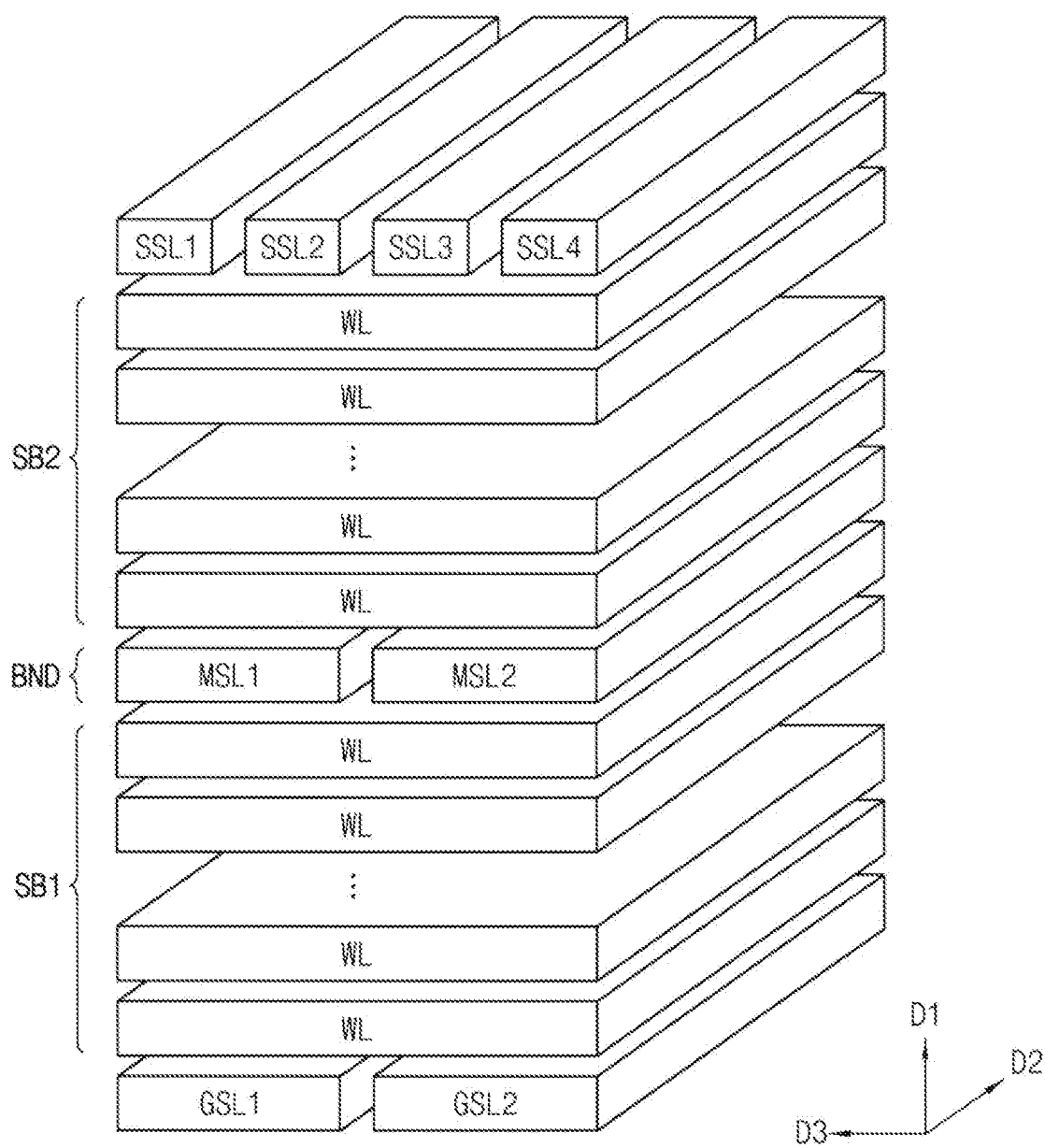
FIG. 14 is a perspective view illustrating a memory block according to example embodiments.

Each string selection transistor SST may be connected to a corresponding string selection line (one of SSL1 to SSL3). The plurality of memory cells MC1 to MC8 may be connected to corresponding gate lines GTL1 to GTL8, respectively. The gate lines GTL1 to GTL8 may be word lines and some of the gate lines GTL1 to GTL8 may be dummy word lines. In addition, some of the gate lines GTL1 to GTL8 may be intermediate switching lines as illustrated in FIG. 14 and the memory cells connected to the intermediate switching lines may be referred to as intermediate switching transistors. Each ground selection transistor GST may be connected to a corresponding ground selection line (one of GSL1 to GSL3). Each string selection transistor SST may be connected to a corresponding bit line (e.g., one of BL1, BL2 and BL3), and each ground selection transistor GST may be connected to the common source line CSL.

Word lines (e.g., WL1) having the same height may be commonly connected, and the ground selection lines GSL1 to GSL3 and the string selection lines SSL1 to SSL3 may be separated. Even though not illustrated, the gate lines corresponding to the intermediate switching lines may be separated as will be described below. In FIG. 6, the memory block BLKi is illustrated to be coupled to eight gate lines GTL1 to GTL8 and three bit lines BL1 to BL3. However, example embodiments are not limited thereto. Each memory block in the memory cell array 100 may be coupled to any number of word lines and any number of bit lines.

Hereinafter, the memory cells or reference numerals of the memory cells may be omitted and only the gate lines stacked in the vertical direction may be illustrated in figures of a memory block for convenience of illustration. The gate lines may include a string selection line SSL, a word line WL, a dummy word line DWL, an intermediate switching line MSL and a ground selection line GSL. The transistors driven by the intermediate switching line MSL may be referred to as intermediate switching transistors. For convenience of illustration and description, only four cell strings STR1~STR4 are connected to a same bit line BL in following figures. However, example embodiments are not limited thereto, and the number of cell strings may be determined variously.

Figure 7:
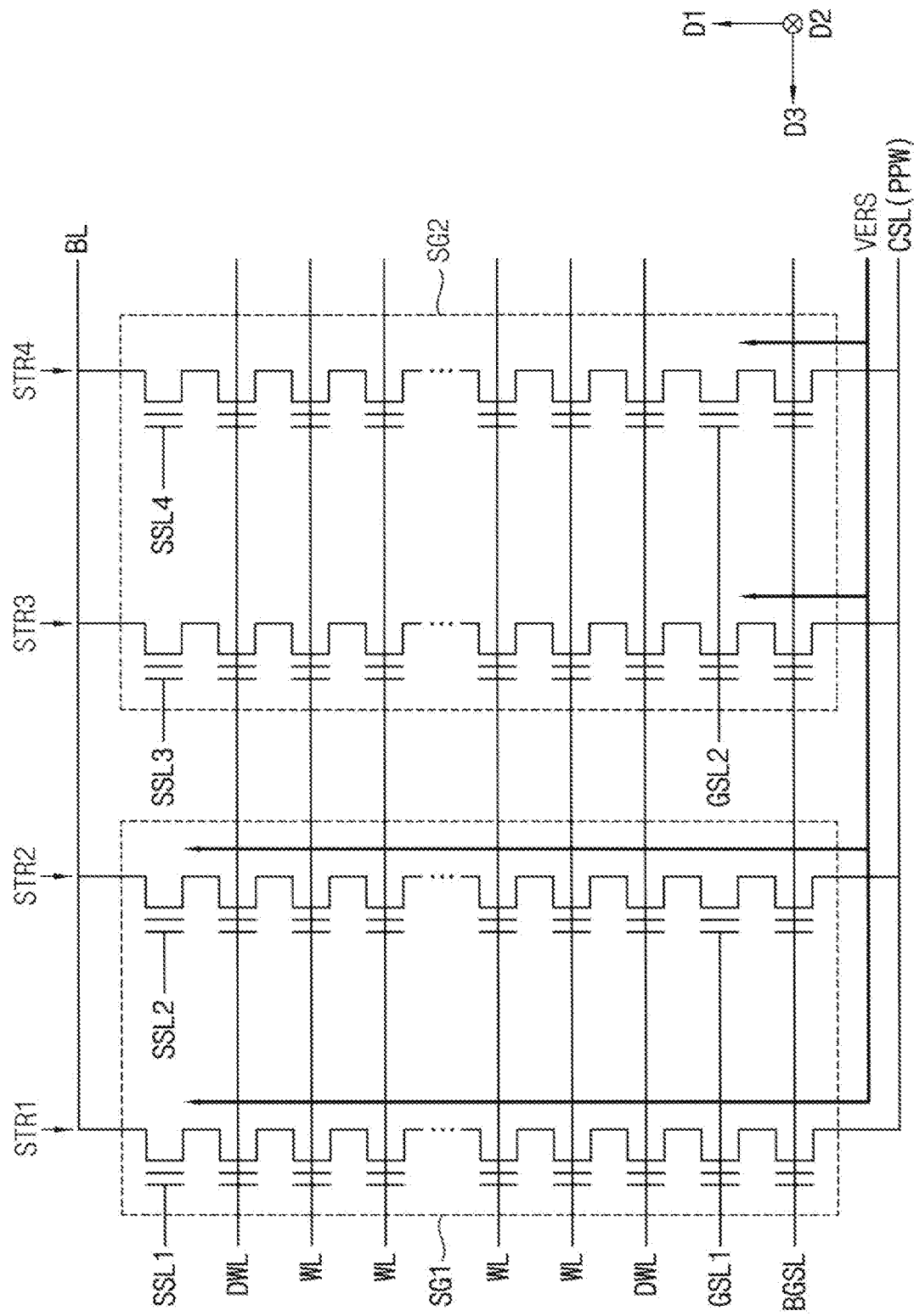
FIG. 7 is a memory block according to example embodiments.

FIG. 7 is a memory block according to example embodiments.

FIG. 7 illustrates only a plurality of cell strings STR1~STR4 connected to a single bit line BL for convenience of illustration. As described with reference to FIG. 6, a plurality of bit lines extending in the third direction D3 may be arranged in the second direction D2 and the cell strings respectively connected to the plurality of bit lines may be connected to each of the string selection lines SSL1~SSL4.

Referring to FIG. 7, a memory block may include a plurality of cell strings STR1~STR4 and each cell string may include a plurality of memory cells disposed in the vertical direction or the first direction D1.

The plurality of cell strings STR1~STR4 may be divided into a plurality of string groups SG1 and SG2. For convenience of illustration and description, FIG. 7 illustrates a non-limiting example that the four cell strings connected to the one bit line is divided two by two into the two string groups SG1 and SG2. The number of the cell strings connected to each bit line, the number of string groups and the number of the cell strings in each string group may be determined variously.

The string selection lines SSL1~SSL4, the dummy word lines DWL, the word lines WL, the ground selection lines GSL1 and GSL2 and the bottom ground selection line BGSL may be formed in a plurality of gate layers. According to example embodiments, the two or more adjacent dummy word lines DWL may be disposed and/or the bottom ground selection line BGSL may be omitted. The drain ends of the cell strings STR1~STR4 are connected to the bit line BL and the source ends of the cell strings STR1~STR4 are connected to the common source line CSL. According to example embodiments, the erase voltage VERS may be applied to the common source line CSL and/or to the well PPW of the memory block as the well bias voltage.

As illustrated in FIG. 7, the plurality of ground selection lines GSL1 and GSL2 may be formed in the one gate layer and the plurality of ground selection lines GSL1 and GSL2 may be connected to gate electrodes of the ground selection transistors respectively by units of string groups. In other words, a first string group SG1 may correspond to a first ground selection line GSL1 and a second string group SG2 may correspond to a second ground selection line GSL2. Using such ground selection lines GSL1 and GSL2, the erase voltage VERS may be applied only to the channels of the selected string group.

FIG. 7 illustrates an example that the first string group GS1 correspond to the selected string group and the second string group SG2 correspond to the unselected string group. The arrows in FIG. 7 represent that the erase voltage VERS is applied only to the channels of the first string group SG1 and the erase voltage VERS is prevented from being applied to the channels of the first string group SG2.

Figure 8:
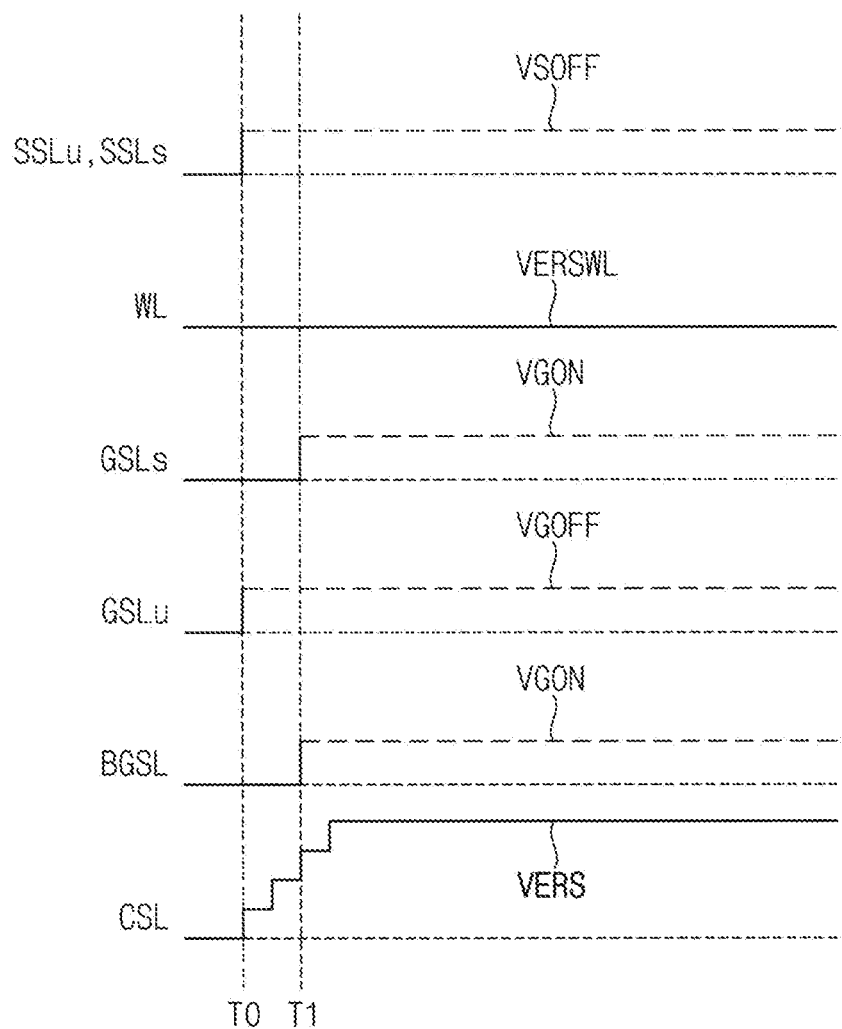
FIGS. 8 and 9 are timing diagrams illustrating example embodiments of performing an erase operation of the memory block of FIG. 7.
Figure 9:
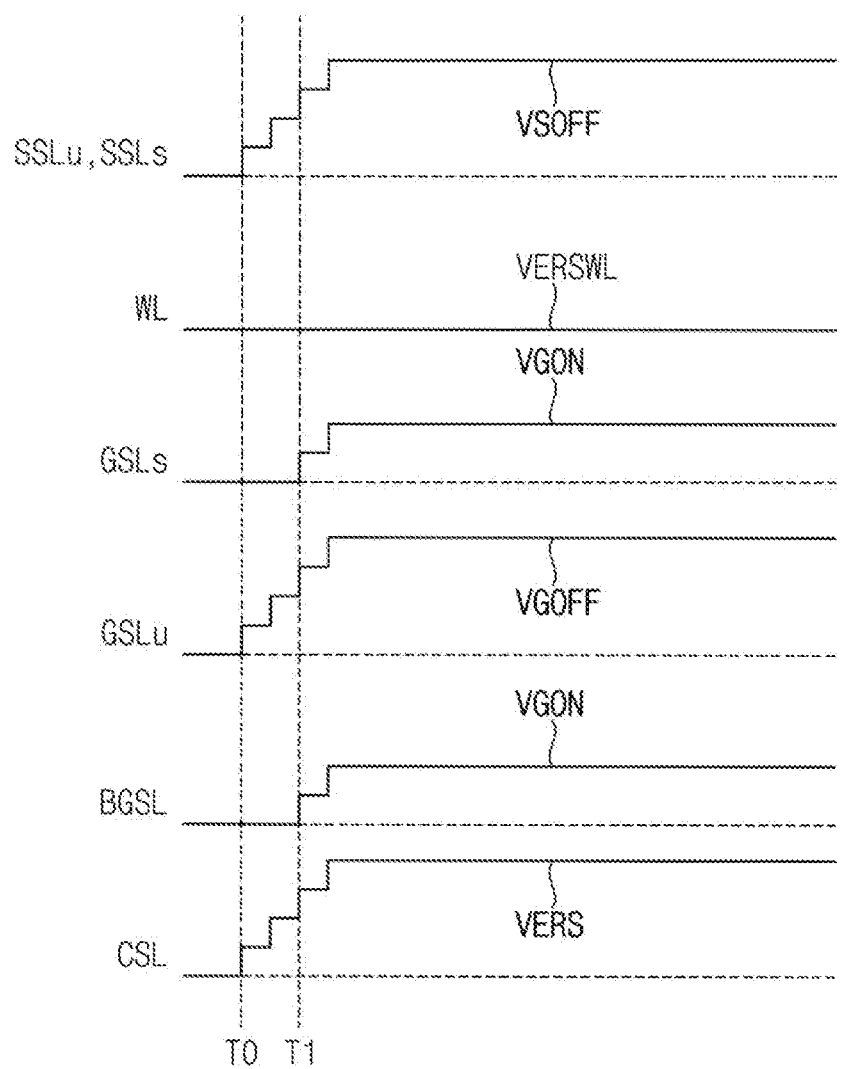

FIGS. 8 and 9 are timing diagrams illustrating example embodiments of performing an erase operation of the memory block of FIG. 7.

For example, the first string group SG1 may correspond to the selected string group and the second string group SG2 may correspond to the unselected string group as illustrated in FIG. 7. The number of the selected string group to be erased is not limited to one but two or more string groups may correspond to the selected string groups to be erased simultaneously.

As represented by the arrows in FIG. 7, the erase voltage VERS is applied only to the channels of the first string group SG1 and the erase voltage VERS is prevented from being applied to the channels of the first string group SG2. In this case, the first string selection line SSL1 corresponds to the selected string selection line SSLs and the other string selection line, that is, the second string selection line SSL2 corresponds to the unselected string selection line SSLu. In addition, the first ground selection line GSL1 corresponds to the selected ground selection line GSLs and the second ground selection line GSL2 corresponds to the unselected ground selection line GSLu.

FIGS. 7, 8 and 9 illustrate example embodiments that the erase voltage VERS is applied through the common source line CSL. Referring to FIGS. 7, 8 and 9, for the erase operation, the erase voltage VERS may be applied to the common source line CSL of the plurality of cell strings STR1~STR4.

A turn-on voltage VGON may be applied to the selected ground selection line GSLs to turn on the selected ground selection transistors of the selected string group SG1 while applying the erase voltage VERS to the common source line CSL. In addition, a turn-off voltage VGOFF may be applied to the unselected ground selection line GSLu to turn off the unselected ground selection transistors of the unselected string group SG2 except the selected string group SG1 among the plurality of string groups SG1 and SG2 while applying the erase voltage VERS to the common source line CSL. The turn-on voltage VGON may be applied to the bottom ground selection line BGSL to turn on the ground selection transistors connected to the bottom ground selection line BGSL while applying the erase voltage VERS to the common source line CSL. As described above, the bottom ground selection line BGSL and the ground selection transistors connected thereto may be omitted.

A turn-off voltage VS OFF may be applied to the selected string selection line SSLs and the unselected string selection line SSLu to turn off all of the string selection transistors of the memory block while applying the erase voltage VERS to the common source line CSL. An erase permission voltage VERSWL may be applied to the word lines WL so that the memory cells of the selected string group SG1 connected to the word lines WL may be erased. Even though not illustrated in FIGS. 8 and 9, an erase inhibition voltage may be applied to the dummy word lines DWL. The erase permission voltage VERSWL may have a voltage level such that a difference between the erase permission voltage VERSWL and the erase voltage VERS may be large enough to erase the memory cells. For example, the erase voltage VERS of about 18 V may be applied to the channels of the memory cells and in this case the erase permission voltage VERSWL applied to the word lines WL may be set to the ground voltage, that is, 0 V.

FIG. 8 illustrates the erase operation by a floating scheme and FIG. 9 illustrates a biasing scheme. In general, floating a control line means neither pulling the control line high nor pulling the control line low, but rather driving output circuits connected to the control line are placed into a high impedance state. Under such conditions, the given control line will move to a potential determined by secondary effects such as leakage currents and substrate potentials. Thus, to "float" a control line is to allow leakage currents and substrate potentials to determine the voltage level of the control line.

As illustrated in FIG. 8, the selected ground selection line GSLs may be floated at time point T1, that is, after a reference delay time is elapsed from a time point T0 when the erase voltage VERS begins to be applied to the common source line CSL, and the unselected ground selection line GSLu may be floated before the reference delay time is elapsed. In FIG. 8, the voltage level represented by a dotted line indicates that the corresponding gate line is floated. The real voltage level of the floated gate line may vary in association with the channel voltage of the corresponding memory cell or transistor. FIG. 8 illustrates an example that the time point T0 of floating the unselected ground selection line GSLu coincides with the time point T0 of applying the erase voltage VERS. As will be described with reference to FIG. 10, the time point of floating the unselected ground selection line GSLu may lag slightly behind the time point T0 of applying the erase voltage VERS.

As illustrated in FIG. 9, the turn-on voltage VGON may be applied to the selected ground selection line GSLs as a bias voltage while applying the erase voltage VERS to the common source line CSL, and the turn-off voltage VGOFF may be applied to the unselected ground selection line GSLu as a bias voltage while applying the erase voltage VERS to the common source line CSL.

Figure 10:
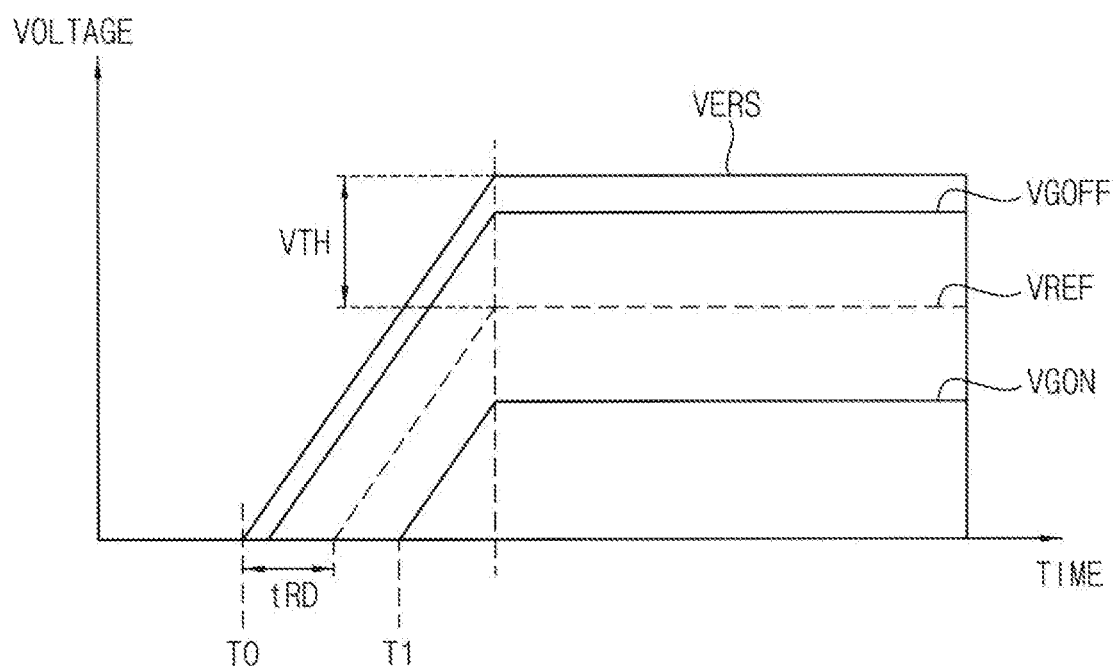
FIG. 10 is a diagram for describing a switching operation of a selection transistor.

FIG. 10 is a diagram for describing a switching operation of a selection transistor.

Referring to FIG. 10, the voltage levels of the turn-on voltage VGON and the turn-off voltage VGOFF of the ground selection transistor may be determined based on the threshold voltage VTH of the ground selection transistor. A reference voltage VREF corresponds to the erase voltage VRES subtracted by the threshold voltage VTH of the ground selection transistor.

If the turn-on voltage VGON lower than the reference voltage VREF is applied to the gate electrode of the ground selection transistor while the erase voltage VERS is applied to the source electrode of the ground selection transistor, the holes or the positive charges are injected to or generated in the channel of the corresponding cell string so that the erase voltage VERS may be applied to the channel. In contrast, if the turn-off voltage VGOFF higher than the reference voltage VREF is applied to the gate electrode of the ground selection transistor while the erase voltage VERS is applied to the source electrode of the ground selection transistor, the injection or the generation of the holes may be prevented.

As described with reference to FIG. 8, the selected ground selection line GSLs may be floated at time point T1 after a reference delay time tRD is elapsed from time point T0 of applying the erase voltage VERS. In this case, the voltage of the selected ground selection line GSLs may be maintained a difference larger than the threshold voltage VERS with respect to the erase voltage VERS even though the voltage of the selected ground selection line GSLs is boosted according to the increase of the erase voltage VERS. As a result, the voltage of the selected ground selection line GSLs may be maintained at the turn-on voltage VGON that is lower than the reference voltage VREF. In contrast, if the unselected ground selection line GSLu is floated before the reference delay time tRD is elapsed, the voltage of the unselected ground selection line GSLu may be maintained at the turn-off voltage VGOFF that is higher than the reference voltage VREF. In addition, the turn-on voltage VGON and the turn-off voltage VGOFF as illustrated in FIG. 10 may be implemented by the biasing scheme as illustrated in FIG. 9.

The ground selection transistors may be prevented from being erased by maintaining the difference between the turn-on voltage VGON and the erase voltage VERS and the difference between the turn-off voltage VGOFF and the erase voltage VERS. Also the turn-on voltage VSON and the turn-off voltage VSOFF of the string selection transistors may be controlled in the same way as described with reference to FIG. 10.

As such, the voltage of the selected ground selection line GSLs corresponding to the selected string group may be maintained at the turn-on voltage VGON lower than the reference voltage VREF while applying the erase voltage VERS to the common source line CSL, where the reference voltage VREF corresponds to the erase voltage VERS subtracted by the threshold voltage VTH of the ground selection transistors. In addition, the voltage of the unselected ground selection lines GSLu corresponding to the unselected string groups except the selected string group among the plurality of string groups may be maintained at the turn-off voltage VGOFF higher than the reference voltage VREF while applying the erase voltage VERS to the common source line CSL.

FIGS. 11A through 13B are diagrams illustrating a method of performing an erase operation in a nonvolatile memory device according to example embodiments.

As described with reference to FIGS. 8 through 10, the erase voltage VERS through the common source line CSL may be applied only to the channels of the selected string group SG1 by selectively turning on only the selected ground selection transistors of the selected string group SG1. As a result, only the memory cells of the selected string group SG1 may be erased selectively. Hereinafter, the descriptions repeated with FIGS. 7 through 10 may be omitted. Although example embodiments will be described below based on the bias scheme as described with reference to FIG. 9, it would be easily understood that also the floating scheme as described with reference to FIG. 8 may be adopted.

Figure 11A:
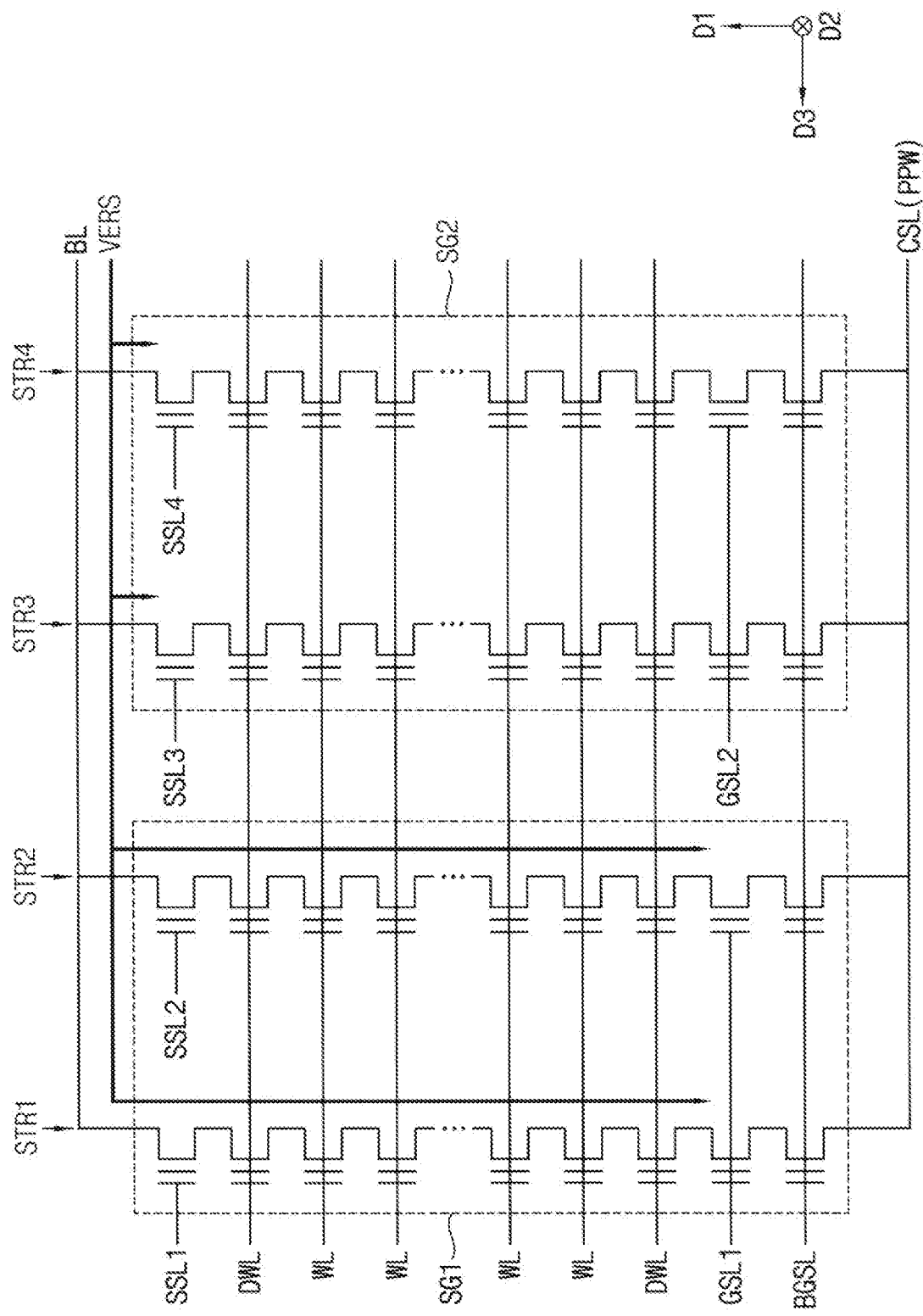
Figure 11B:
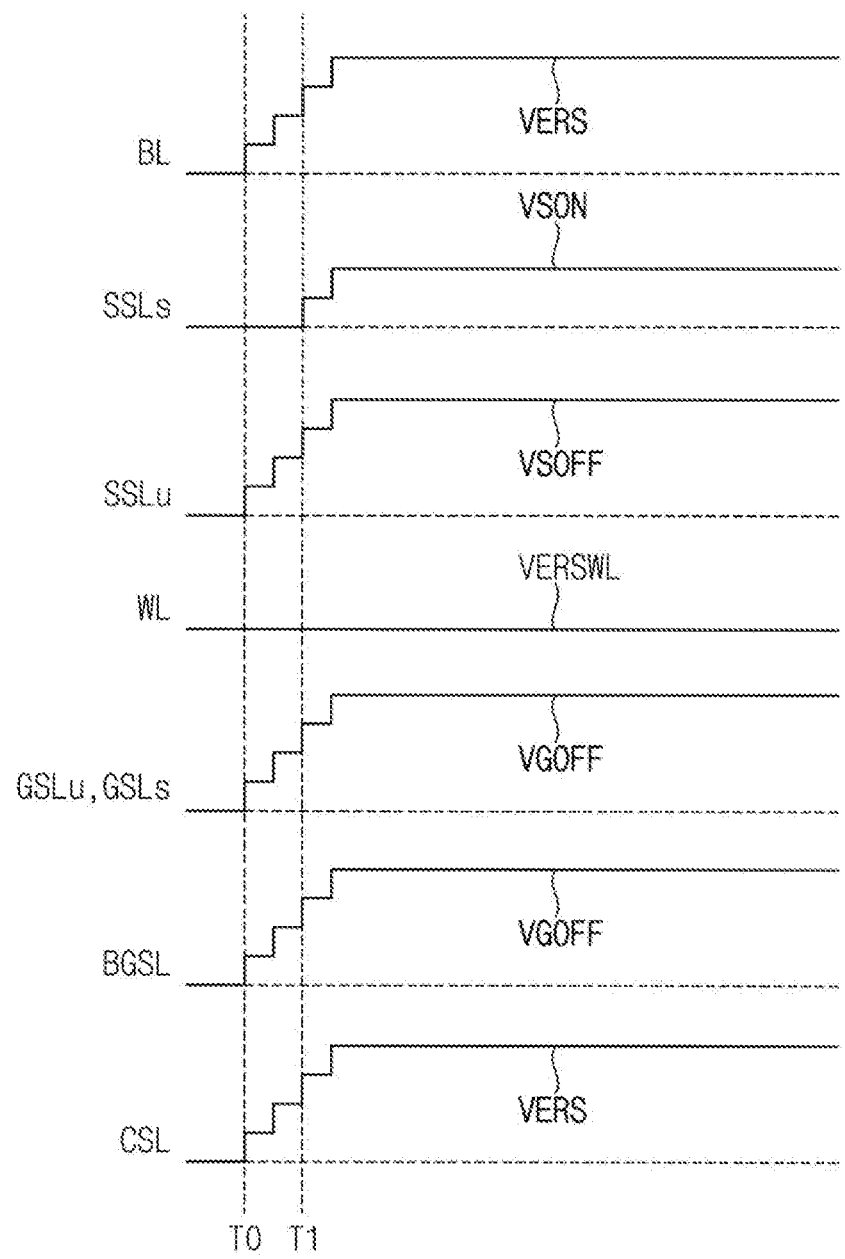

FIGS. 11A and 11B illustrate example embodiments that the erase voltage VERS is applied through bit lines of the memory block. The memory block of FIG. 11A is substantially the same as the memory block of FIG. 7 and the repeated descriptions are omitted. Referring to FIGS. 11A and 11B, for the erase operation, the erase voltage VERS may be applied to the bit line BL of the cell strings STR1~STR4.

A turn-on voltage VSON may be applied to the selected string selection line SSLs to turn on the selected string selection transistors of the selected string group SG1 while applying the erase voltage VERS to the bit line BL. In addition, a turn-off voltage VSOFF may be applied to the unselected string selection line SSLu to turn off the unselected string selection transistors of the unselected string group SG2 while applying the erase voltage VERS to the bit line BL. A turn-off voltage VGOFF may be applied to the selected ground selection line GSLs, the unselected ground selection line GSLu and the bottom ground selection line BGSL to turn off all of the ground selection transistors while applying the erase voltage VERS to the common source line CSL. The erase permission voltage VERSWL may be applied to the word lines WL.

Figure 12A:
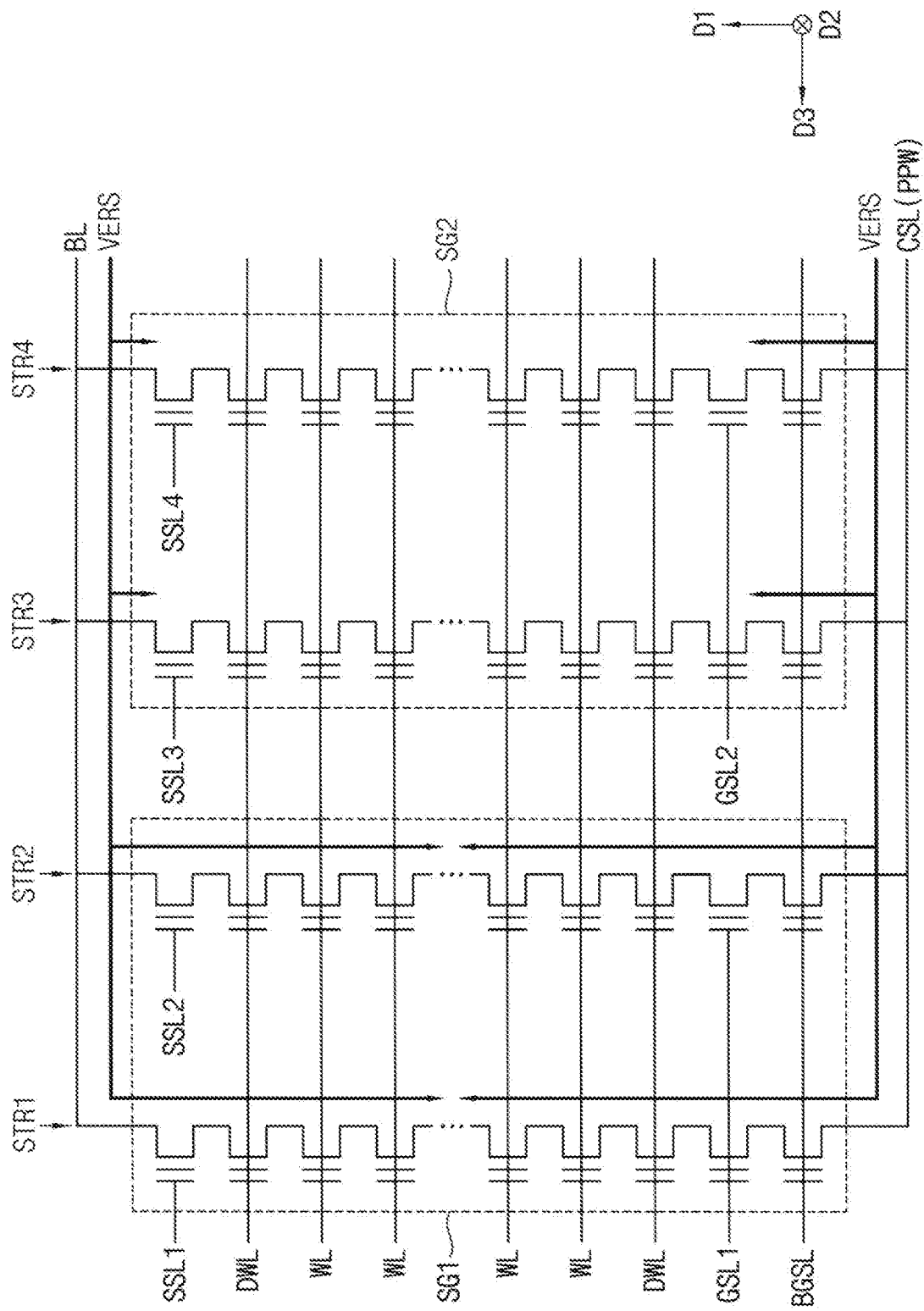
Figure 12B:
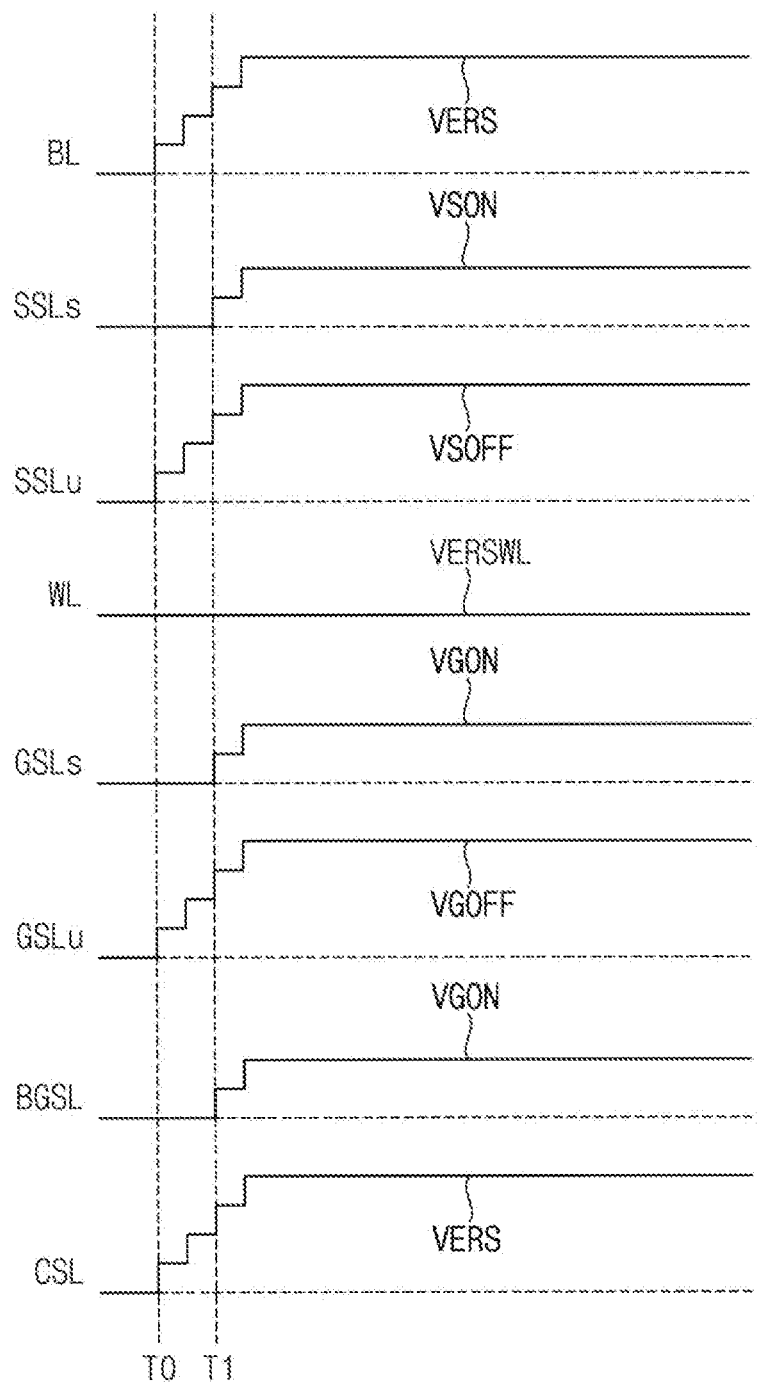

FIGS. 12A and 12B illustrate example embodiments that the erase voltage VERS is applied through the common source line CSL and the bit lines BL of the memory block. The memory block of FIG. 12A is substantially the same as the memory block of FIG. 7 and the repeated descriptions are omitted. Referring to FIGS. 12A and 12B, for the erase operation, the erase voltage VERS may be applied to the common source line CSL and the bit line BL of the cell strings STR1~STR4.

A turn-on voltage VGON may be applied to the selected ground selection line GSLs to turn on the selected ground selection transistors of the selected string group SG1 while applying the erase voltage VERS to the common source line CSL. In addition, a turn-on voltage VSON may be applied to the selected string selection line SSLs to turn on the selected string selection transistors of the selected string group SG1 while applying the erase voltage VERS to the bit line BL.

A turn-off voltage VGOFF may be applied to the unselected ground selection line GSLu to turn off the unselected ground selection transistors of the unselected string group SG2 except the selected string group SG1 among the plurality of string groups SG1 and SG2 while applying the erase voltage VERS to the common source line CSL. In addition, a turn-off voltage VSOFF may be applied to the unselected string selection line SSLu to turn off the unselected string selection transistors of the unselected string group SG2 while applying the erase voltage VERS to the bit line BL.

The turn-on voltage VGON may be applied to the bottom ground selection line BGSL to turn on the ground selection transistors connected to the bottom ground selection line BGSL while applying the erase voltage VERS to the common source line CSL. As described above, the bottom ground selection line BGSL and the ground selection transistors connected thereto may be omitted. The erase permission voltage VERSWL may be applied to the word lines WL.

Figure 13B:
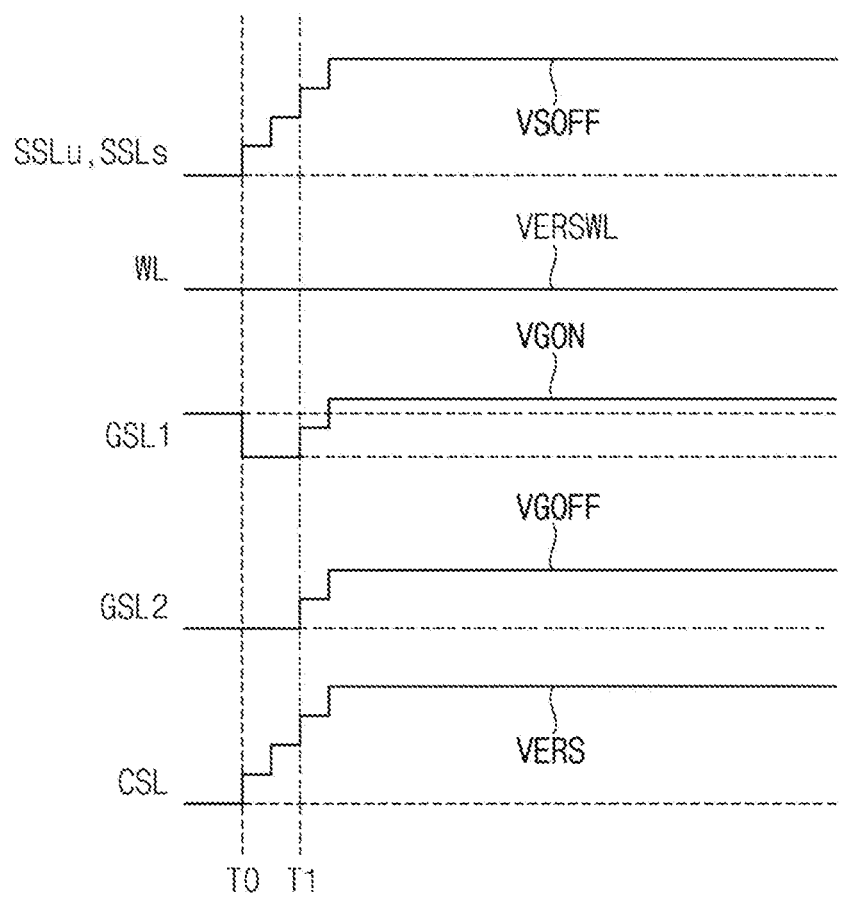

FIGS. 13A and 13B illustrate example embodiments that a plurality of ground selection lines are formed respectively in a plurality of gate layers in which ground selection transistors are formed and threshold voltages of the ground selection transistors are set differently. The memory block of FIG. 13A is substantially the same as the memory block of FIG. 7 and the repeated descriptions are omitted.

Referring to FIG. 13A, a first ground selection line GSL1 may be formed in a first gate layer in which first ground selection transistors are formed, and a second ground selection line GSL2 may be formed in a second gate layer in which second ground selection transistors are formed. The first ground selection line GSL1 may be connected commonly to gate electrodes of the first ground selection transistors and the second ground selection line GSL2 may be connected commonly to gate electrodes of the second ground selection transistors.

The first ground selection transistors of a first string group SG1 may be set to a first threshold voltage VTH1 and the second ground selection transistors of the first string group SG1 may be set to a second threshold voltage VTH2 higher than the first threshold voltage VTH1. In contrast, the first ground selection transistors of a second string group SG2 may be set to the second threshold voltage VTH2 and the second ground selection transistors of the second string group SG2 may be set to the first threshold voltage VTH1.

Referring to FIGS. 13A and 13B, a turn-on voltage VGON may be applied to the first ground selection line GSL1 and a turn-off voltage VGOFF may be applied to the second ground selection line GSL2 while the erase voltage VERS is applied to the common source line CSL. Here, the turn-on voltage VGON corresponds to a voltage level capable of turning on the ground selection transistors having the first threshold voltage VTH1 and the second threshold voltage VTH2. In contrast, the turn-off voltage VGOFF corresponds to a voltage level capable of turning on only the ground selection transistors having the second threshold voltage VTH2 and turning off the ground selection transistors having the first threshold voltage VTH1. In other words, the voltage of the selected ground selection line GSL1 corresponding to the selected string group SG1 may be maintained at the turn-on voltage VGON lower than a reference voltage and the voltage of the unselected ground selection line GSL2 corresponding to the unselected string group SG2 may be maintained at the turn-off voltage VGOFF higher than the reference voltage while applying the erase voltage VERS to the common source line CSL. Here, the reference voltage corresponds to the erase voltage VERS subtracted by the first threshold voltage VTH1.

As a result, in case of the selected string group SG1, both of the first ground selection transistors and the second ground selection transistors may be turned on to apply the erase voltage VERS to the channels of the selected string group SG1. In contrast, in case of the unselected string group SG2, the first ground selection transistors having the second threshold voltage VTH2 may be turned on but the second ground selection transistors having the first threshold voltage VTH1 may be turned off to block the erase voltage VERS from being applied to the channels of the unselected string group SG2.

FIG. 14 is a perspective view illustrating a memory block according to example embodiments.

In FIG. 14, memory cells are omitted and gate lines stacked in the vertical direction D1 are illustrated for convenience of illustration. The gate lines may include string selection lines SSL1~SSL4, word lines WL, intermediate switching lines MSL1 and MSL2 and ground selection lines GSL1 and GSL2. The first intermediate switching line MSL1 and the first ground selection line GSL1 correspond to a first string group and the second intermediate switching line MSL2 and the second ground selection line GSL2 correspond to a second string group.

Referring to FIG. 14, a memory block including a plurality of cell strings may be divided into a plurality of sub blocks SB1 and SB2. The intermediate switching lines MSL1 and MSL2 and intermediate switching transistors controlled by the intermediate switching lines MSL1 and MSL2 may be formed in a boundary layer BND between the sub blocks SB1 and SB2.

Figure 15:
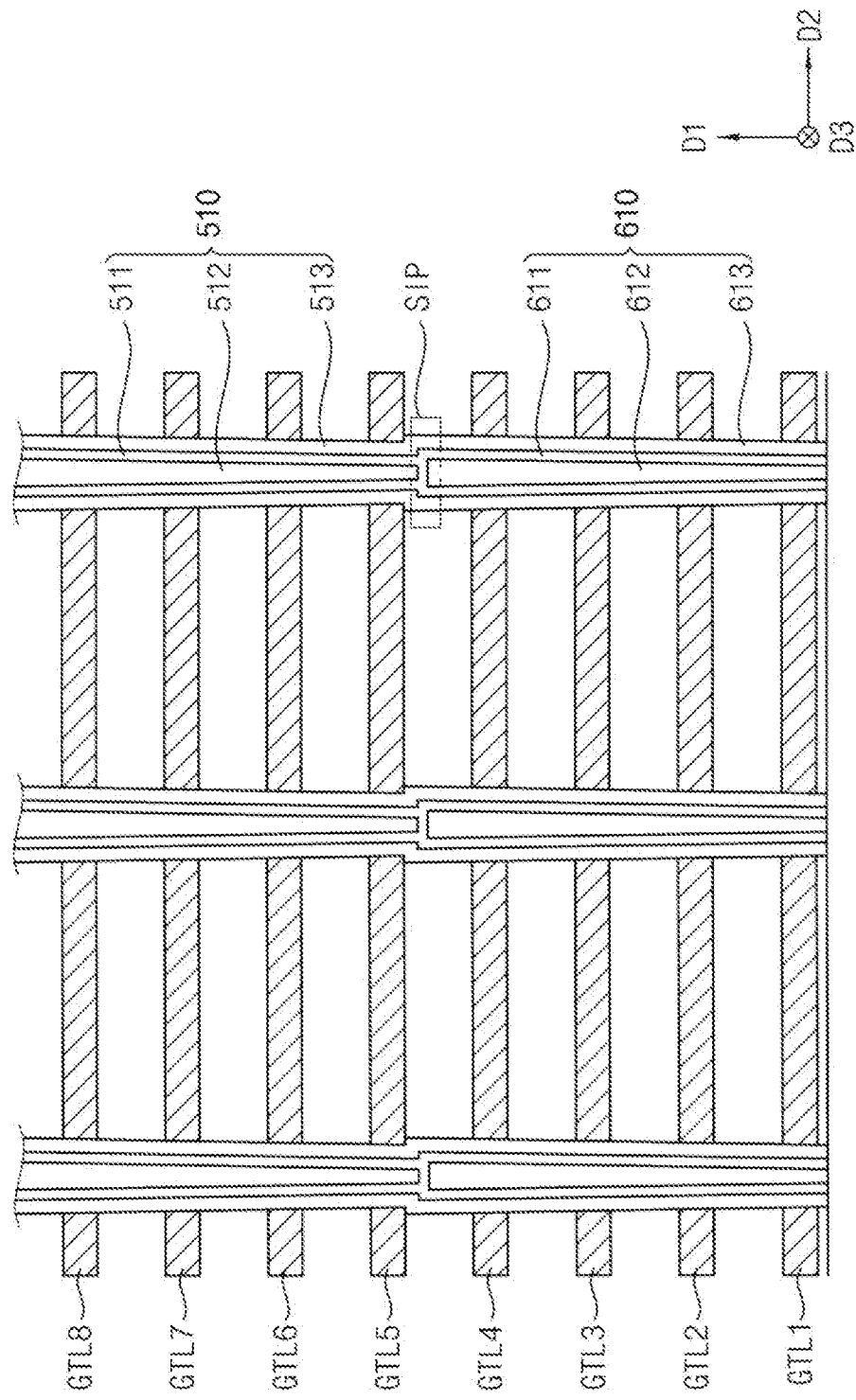
FIG. 15 is a cross-sectional view for describing an example embodiment of a boundary layer included in the memory block of FIG. 14.

FIG. 15 is a cross-sectional view for describing an example embodiment of a boundary layer included in the memory block of FIG. 14.

Referring to FIG. 15, a channel hole of each cell string STR may include a first sub channel hole 610 and a second sub channel hole 510. A channel hole may be referred to as a pillar. The first sub channel hole 610 may include a channel layer 611, an inner material 612 and an insulation layer 613. The second sub channel hole 510 may include a channel layer 511, an inner material 512 and an insulation layer 513. The channel layer 611 of the first channel hole 610 may be connected to the channel layer 511 of the second sub channel hole 510 through a P-type silicon pad SIP. The sub channel holes 610 and 510 may be formed using a stopper line GTL5 having an appropriate etch rate. For example, the stopper line GTL5 may be formed of polysilicon and the other gate lines GTL1~GTL4 and the GTL6~GTL8 may be formed of metal such as tungsten to implement the appropriate etch rate.

The boundary layer BND between the sub blocks SB1 and SB2 in FIG. 14 may correspond to the stopper layer GTL5 that is used to form the plurality of sub channel holes. The cells in the stopper layer GTL5 may be improper for storing data, and the stopper layer GTL5 may be used as the boundary layer BND to form the intermediate switching transistors.

Hereinafter, example embodiments of selectively switching a plurality of intermediate switching transistors by units of string groups based on an erase address and a direction in which an erase voltage is applied with reference to FIGS. 16A through 20B. One of a first group segment of the selected string group under the boundary layer BND and a second group segment of the selected string group over the boundary layer BND may be selectively erased based on the erase address.

FIGS. 16A through 20B are diagrams illustrating a method of performing an erase operation in a nonvolatile memory device according to example embodiments.

Referring to FIGS. 16A, 17A, 18A, 19A and 20A, a memory block of a nonvolatile memory device may include a plurality of cell strings STR1~STR4 and each of the cell strings STR1~STR4 may include a plurality of memory cells that are disposed in the vertical direction or the first direction D1.

The plurality of cell strings STR1~STR4 may be divided into a plurality of string groups SG1 and SG2. In addition, the string groups SG1 and SG2 may be divided into first group segments GRS11 and GRS21 disposed under the boundary layer BND and second group segments GRS12 and GRS22 disposed over the boundary layer BND.

FIGS. 16A through 17B illustrate example embodiments that the erase voltage VERS is applied through the common source line CSL of the memory block. In FIGS. 16A through 17B, the first string group SG1 corresponds to a selected string group and the second string group SG2 corresponds to an unselected string group.

Referring to FIGS. 16A through 17B, for the erase operation, the erase voltage VERS may be applied to the common source line CSL of the cell strings STR1~STR4. A turn-on voltage VGON may be applied to the selected ground selection line GSLs to turn on the selected ground selection transistors of the selected string group SG1 and a turn-off voltage VGOFF may be applied to the unselected ground selection line GSLu to turn off the unselected ground selection transistors of the unselected string group SG2 while applying the erase voltage VERS to the common source line CSL. A turn-off voltage VSOFF may be applied to the selected string selection line SSLs and the unselected string selection line SSLu to turn off all of the string selection transistors of the memory block while applying the erase voltage VERS to the common source line CSL.

Figure 16A:
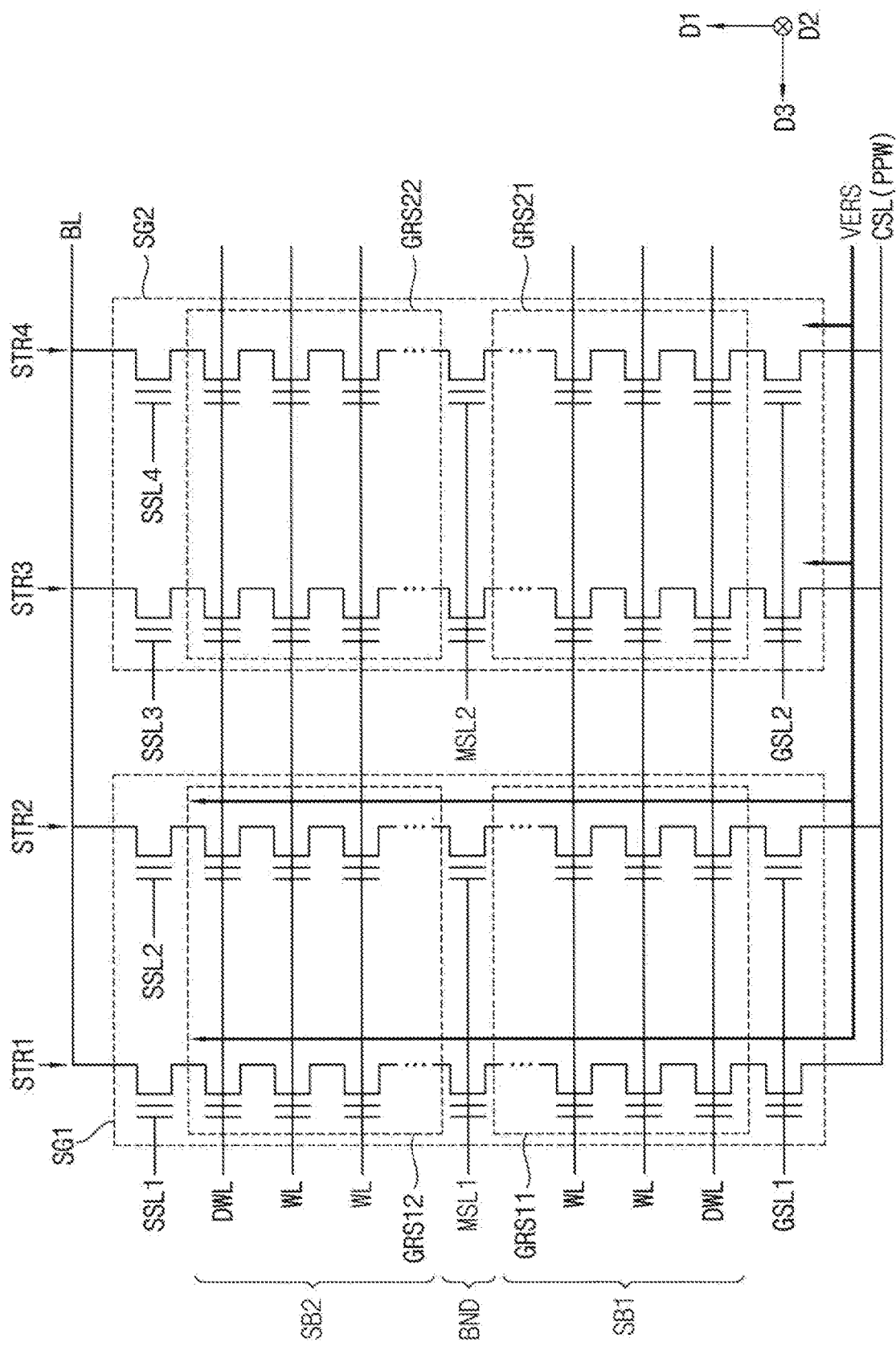
FIGS. 16A-16B, 17A-17B, 18A-18B, 19A-19B and 20A-20B are diagrams illustrating a method of performing an erase operation in a nonvolatile memory device according to example embodiments.
Figure 16B:
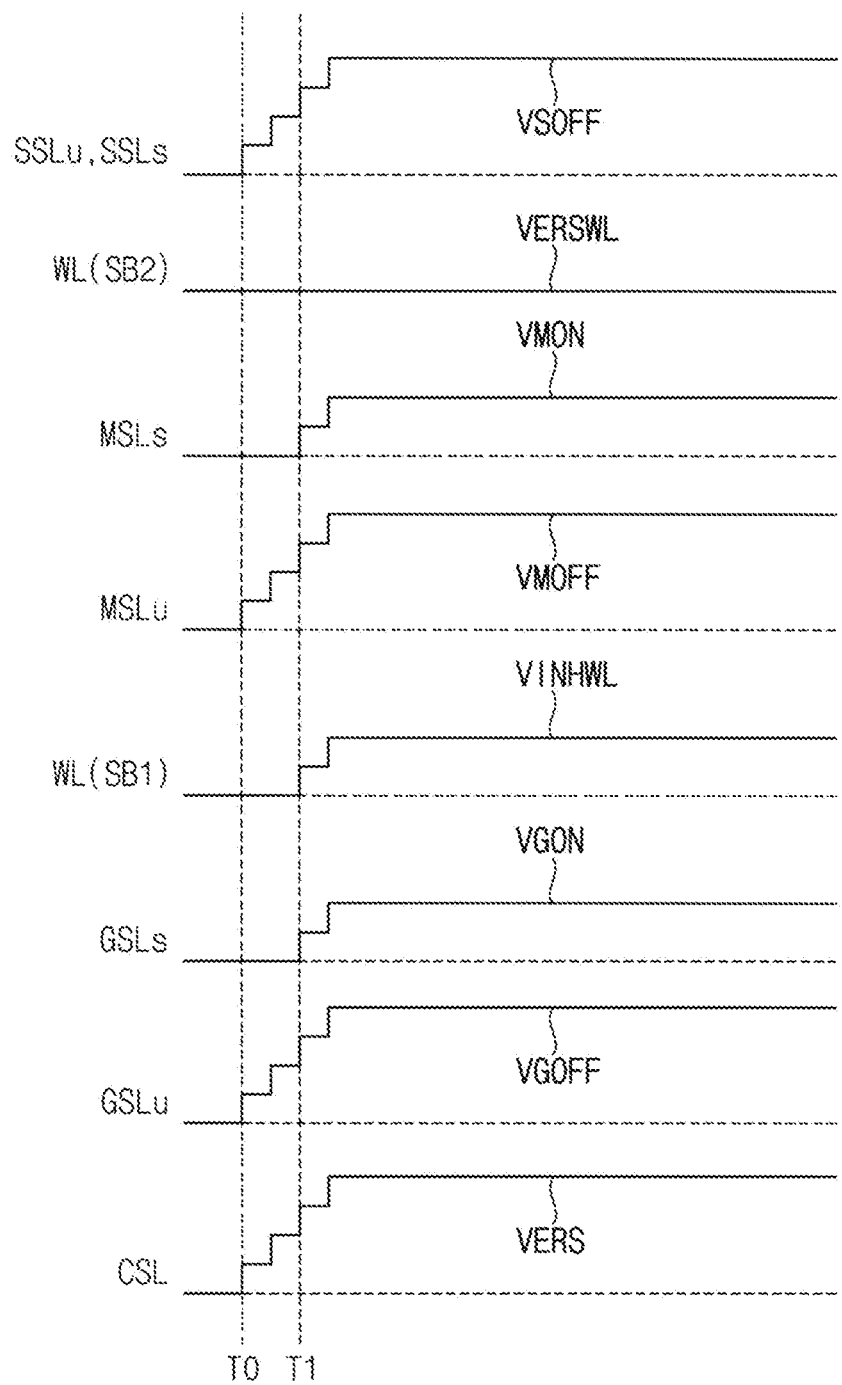
Figure 17A:
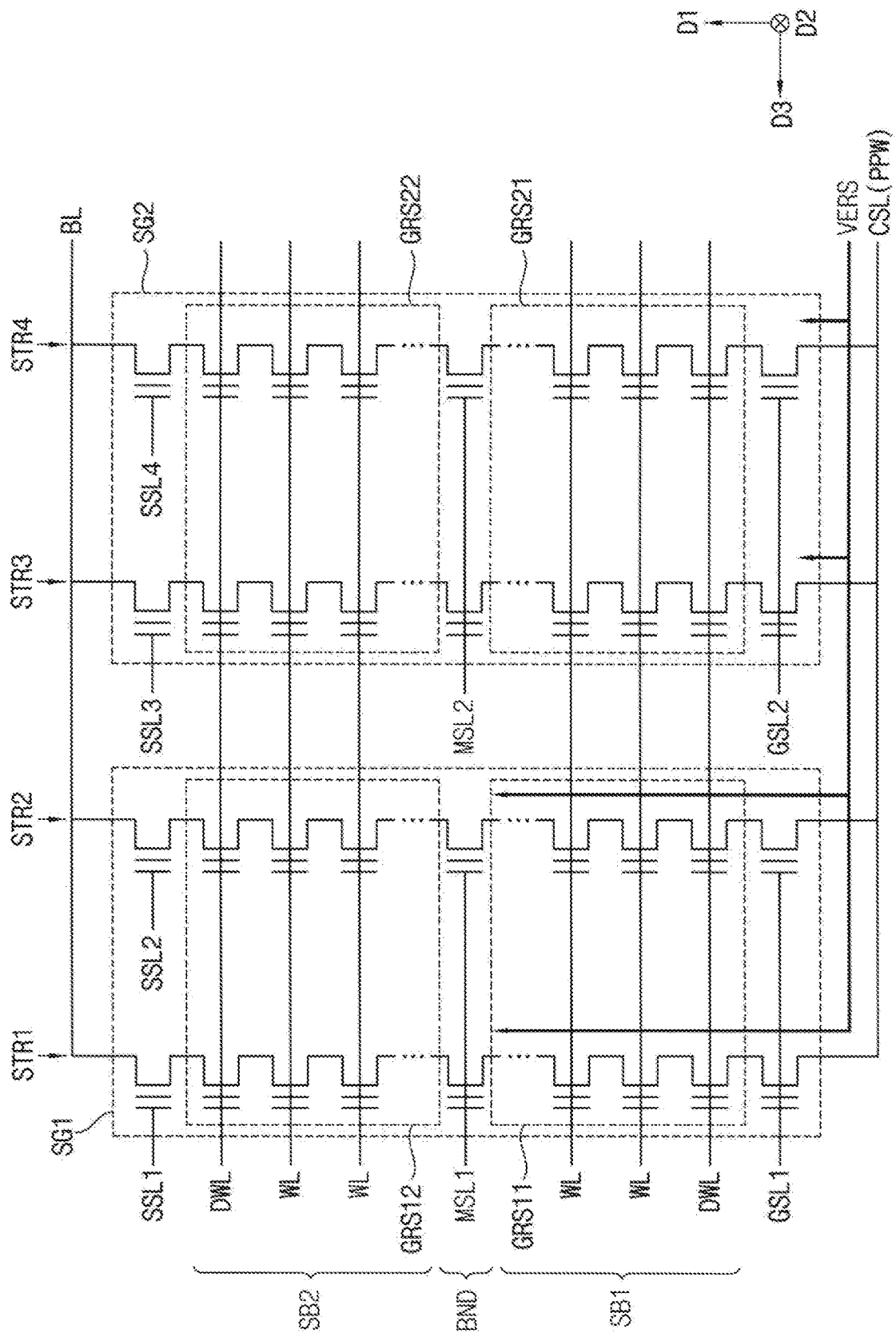
Figure 17B:
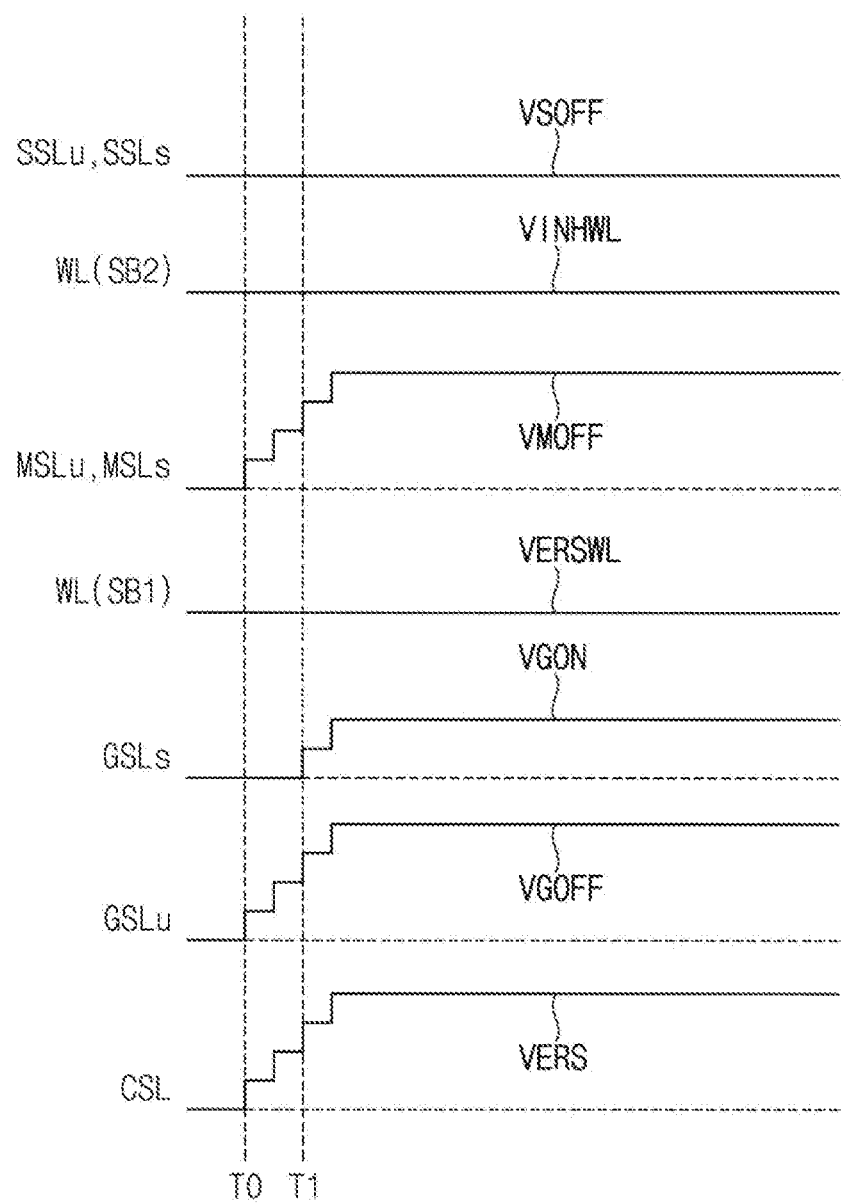

Referring to FIGS. 16A and 16B, when the erase voltage VERS is applied to the common source line CSL and the second group segment GRS12 of the selected string group SG1 is erased, the intermediate switching transistors of the selected string group SG1 may be turned on by applying the turn-on voltage VMON to the selected intermediate switching line MSLs corresponding to the selected string group SG1. Referring to FIGS. 17A and 17B, when the erase voltage VERS is applied to the common source line CSL and the first group segment GRS11 of the selected string group SG1 is erased, the intermediate switching transistors of the selected string group SG1 may be turned off by applying the turn-off voltage VMOFF to the selected intermediate switching line MSLs corresponding to the selected string group SG1.

A turn-off voltage VMOFF may be applied to the unselected intermediate switching line MSLu corresponding to the unselected string group SG2. An erase permission voltage VERSWL may be applied to word lines WL of selected group segments to be erased among the first group segments GRS11 and GRS21 and the second group segments GRS12 and GRS22 and an erase inhibition voltage VINHWL may be applied to word lines WL of unselected group segments not to be erased among the first group segments GRS11 and GRS21 and the second group segments GRS12 and GRS22. A turn-off voltage VSOFF of an appropriate voltage level according to the group segments to be erased may be applied to the selected string selection line SSLs and the unselected string selection line SSLu.

FIGS. 18A through 19B illustrate example embodiments that the erase voltage VERS is applied through the bit lines BL of the memory block. In FIGS. 18A through 19B, the first string group SG1 corresponds to a selected string group and the second string group SG2 corresponds to an unselected string group.

Referring to FIGS. 18A through 19B, for the erase operation, the erase voltage VERS may be applied to the bit line of the cell strings STR1~STR4. A turn-on voltage VSON may be applied to the selected string selection line SSLs to turn on the selected string selection transistors of the selected string group SG1 and a turn-off voltage VSOFF may be applied to the unselected string selection line SSLu to turn off the unselected string selection transistors of the unselected string group SG2 while applying the erase voltage VERS to the bit line BL.

Figure 18A:
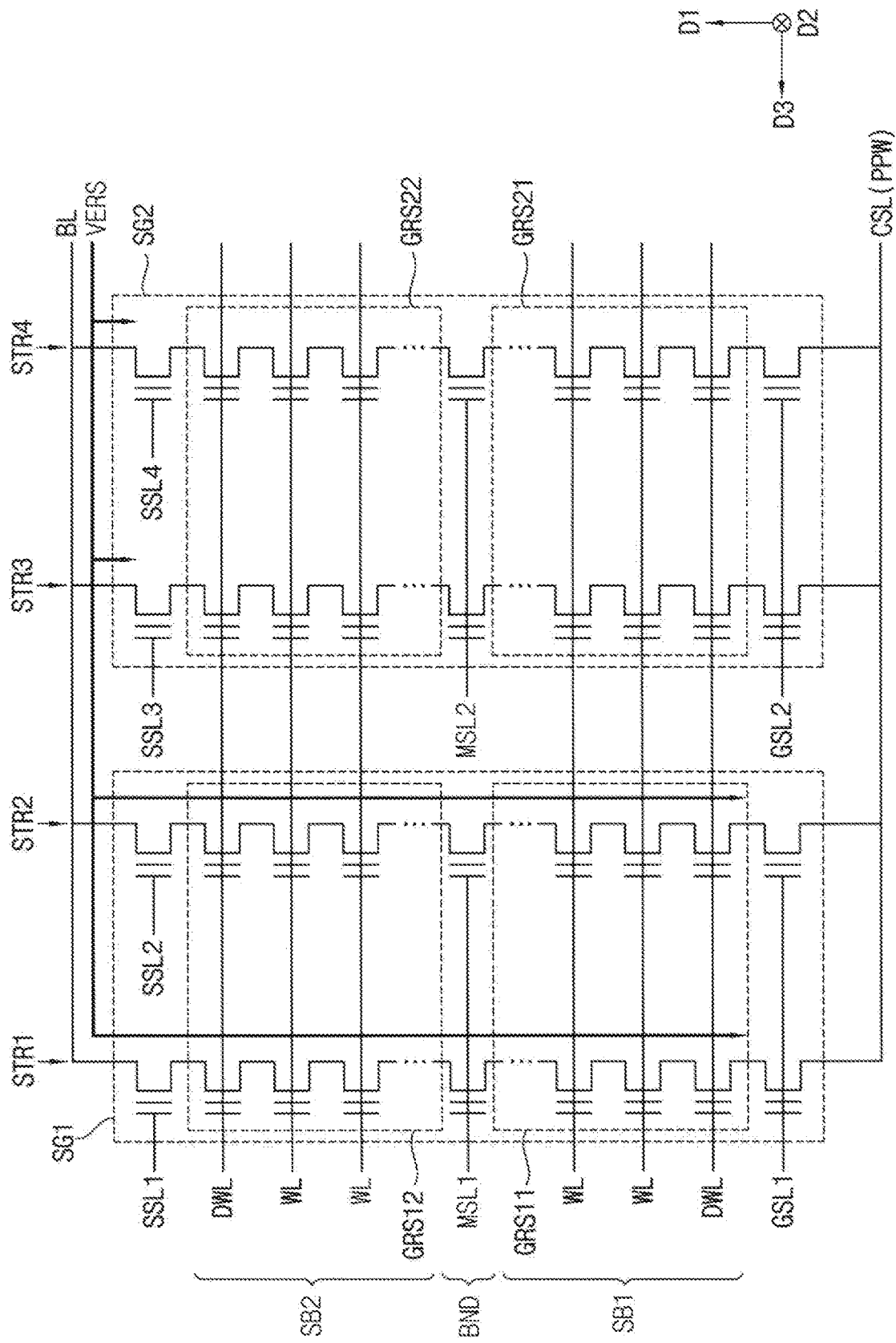
Figure 18B:
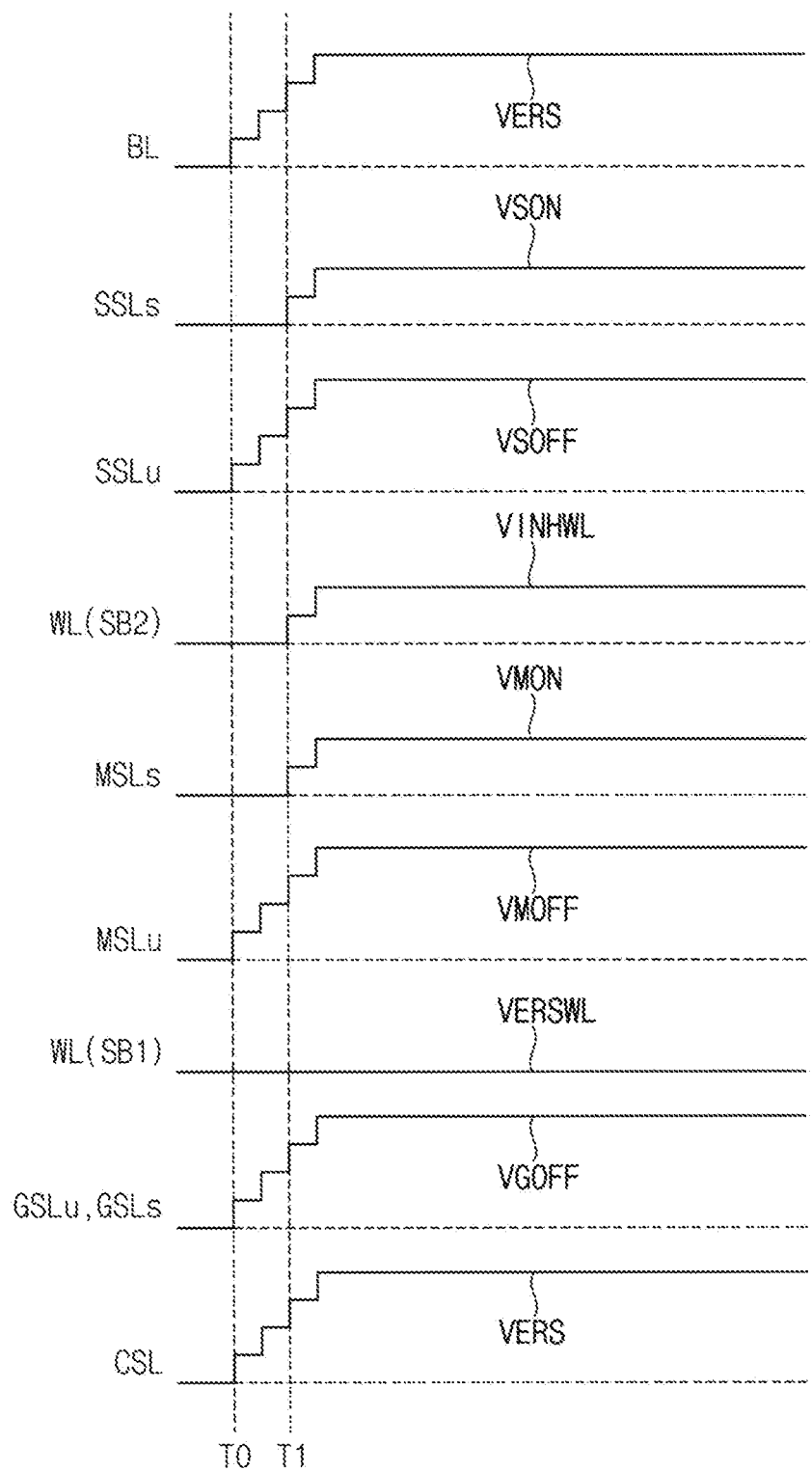
Figure 19A:
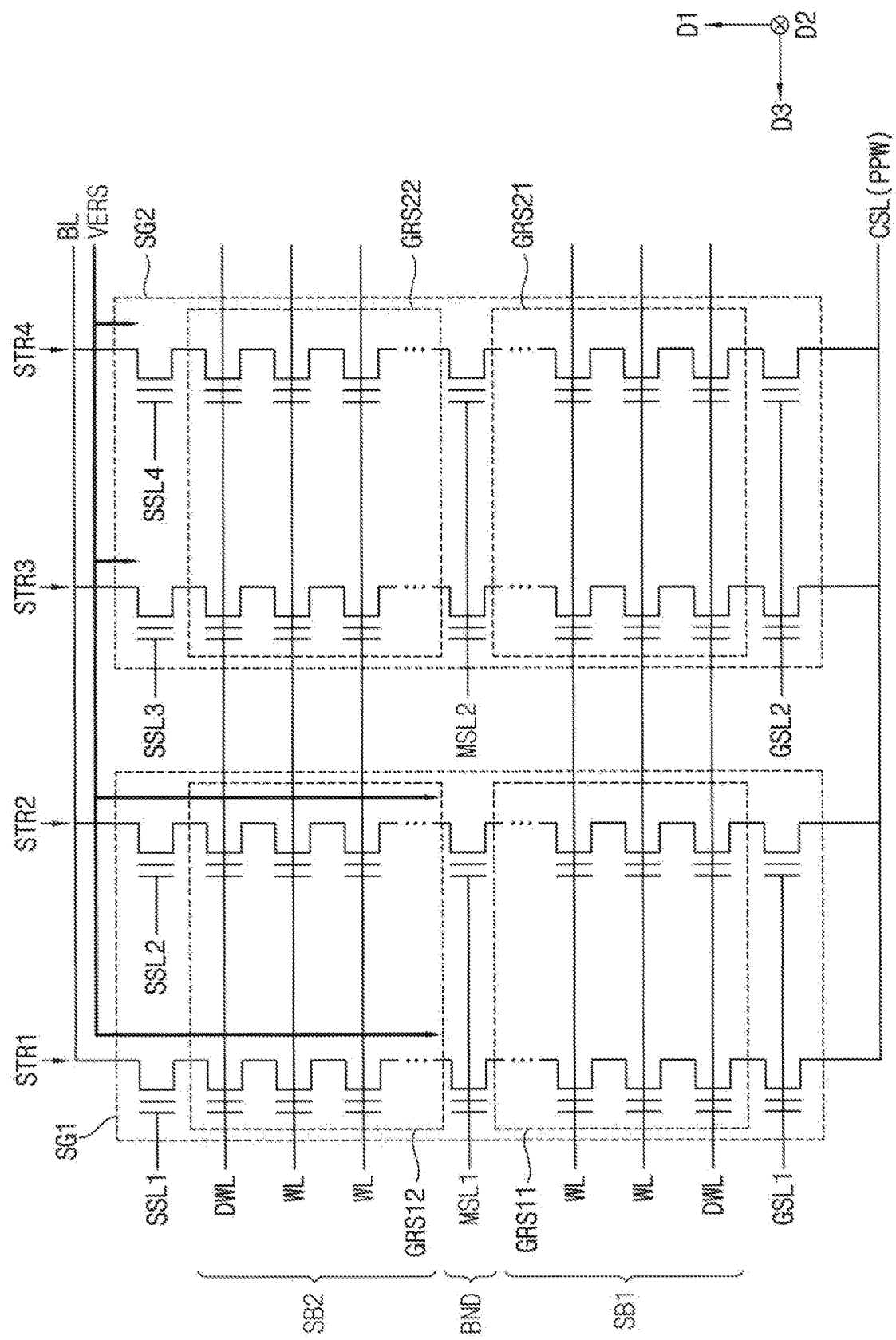
Figure 19B:
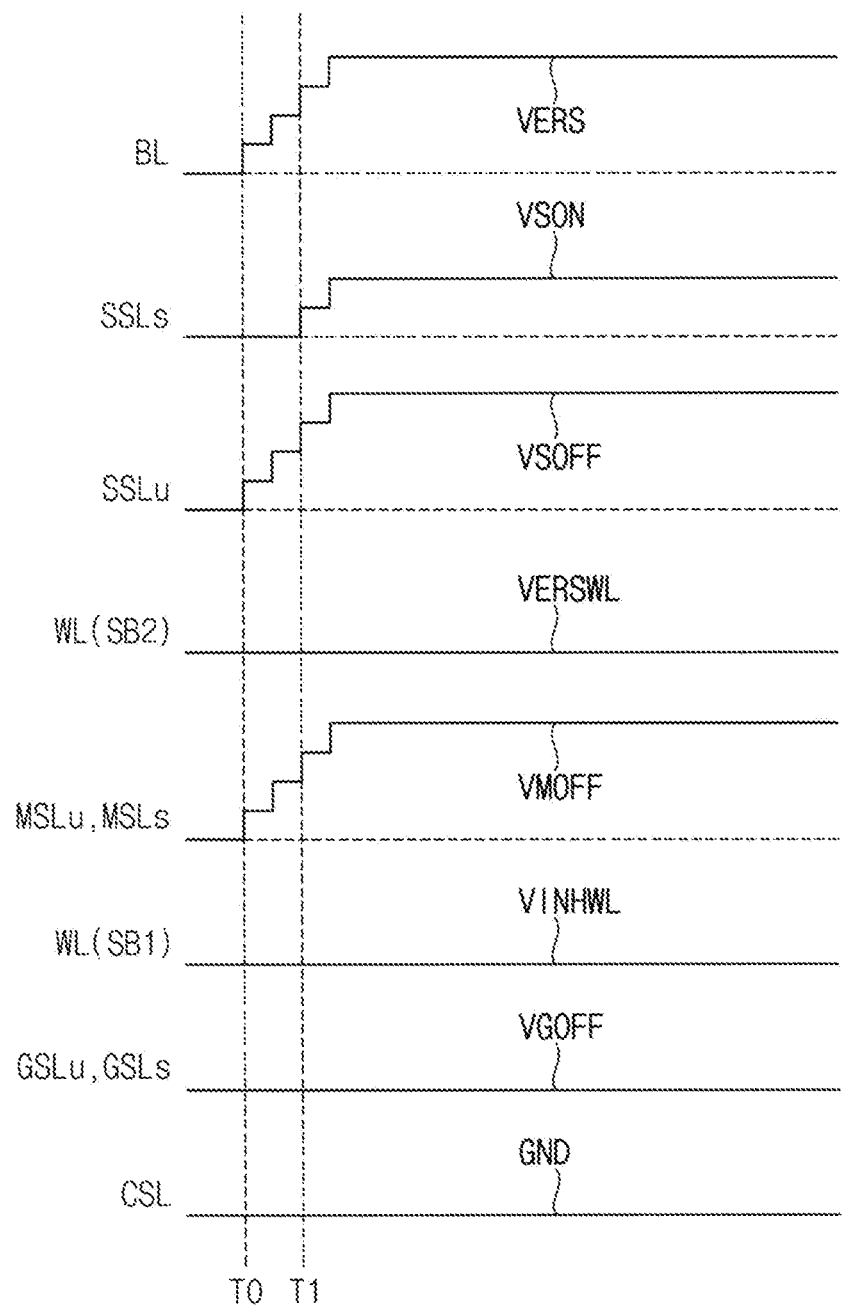

Referring to FIGS. 18A and 18B, when the erase voltage VERS is applied to the bit line BL and the first group segment GRS11 of the selected string group SG1 is erased, the intermediate switching transistors of the selected string group SG1 may be turned on by applying the turn-on voltage VMON to the selected intermediate switching line MSLs corresponding to the selected string group SG1. Referring to FIGS. 19A and 19B, when the erase voltage VERS is applied to the bit line BL and the second group segment GRS12 of the selected string group SG1 is erased, the intermediate switching transistors of the selected string group SG1 may be turned off by applying the turn-off voltage VMOFF to the selected intermediate switching line MSLs corresponding to the selected string group SG1.

A turn-off voltage VMOFF may be applied to the unselected intermediate switching line MSLu corresponding to the unselected string group SG2. An erase permission voltage VERSWL may be applied to word lines WL of selected group segments to be erased among the first group segments GRS11 and GRS21 and the second group segments GRS12 and GRS22 and an erase inhibition voltage VINHWL may be applied to word lines WL of unselected group segments not to be erased among the first group segments GRS11 and GRS21 and the second group segments GRS12 and GRS22. A turn-off voltage VGOFF of an appropriate voltage level according to the group segments to be erased may be applied to the selected ground selection line GSLs and the unselected ground selection line GSLu. The erase voltage VERS or the ground voltage GND may be applied to the common source line CSL.

Figure 20A:
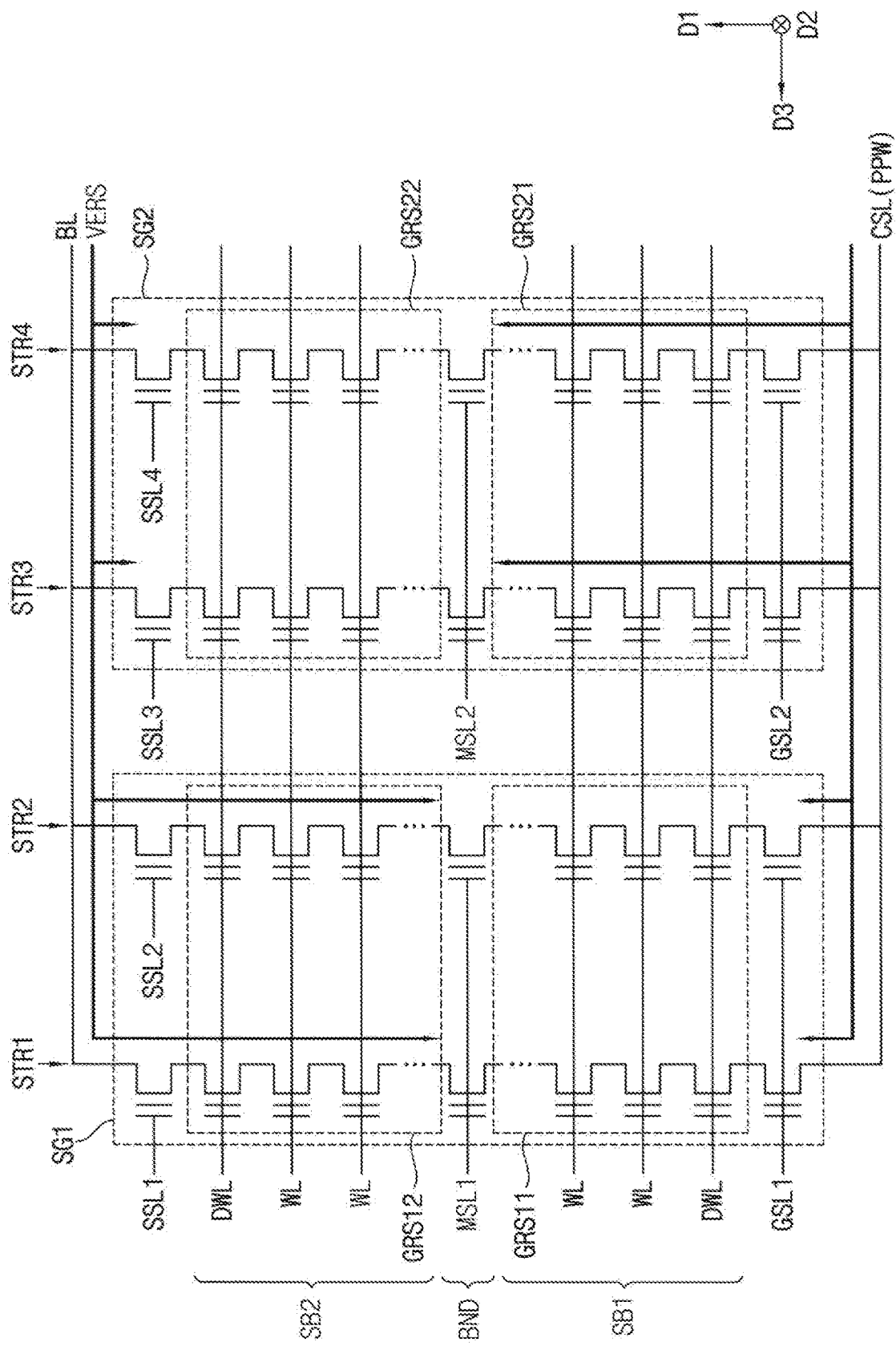
Figure 20B:
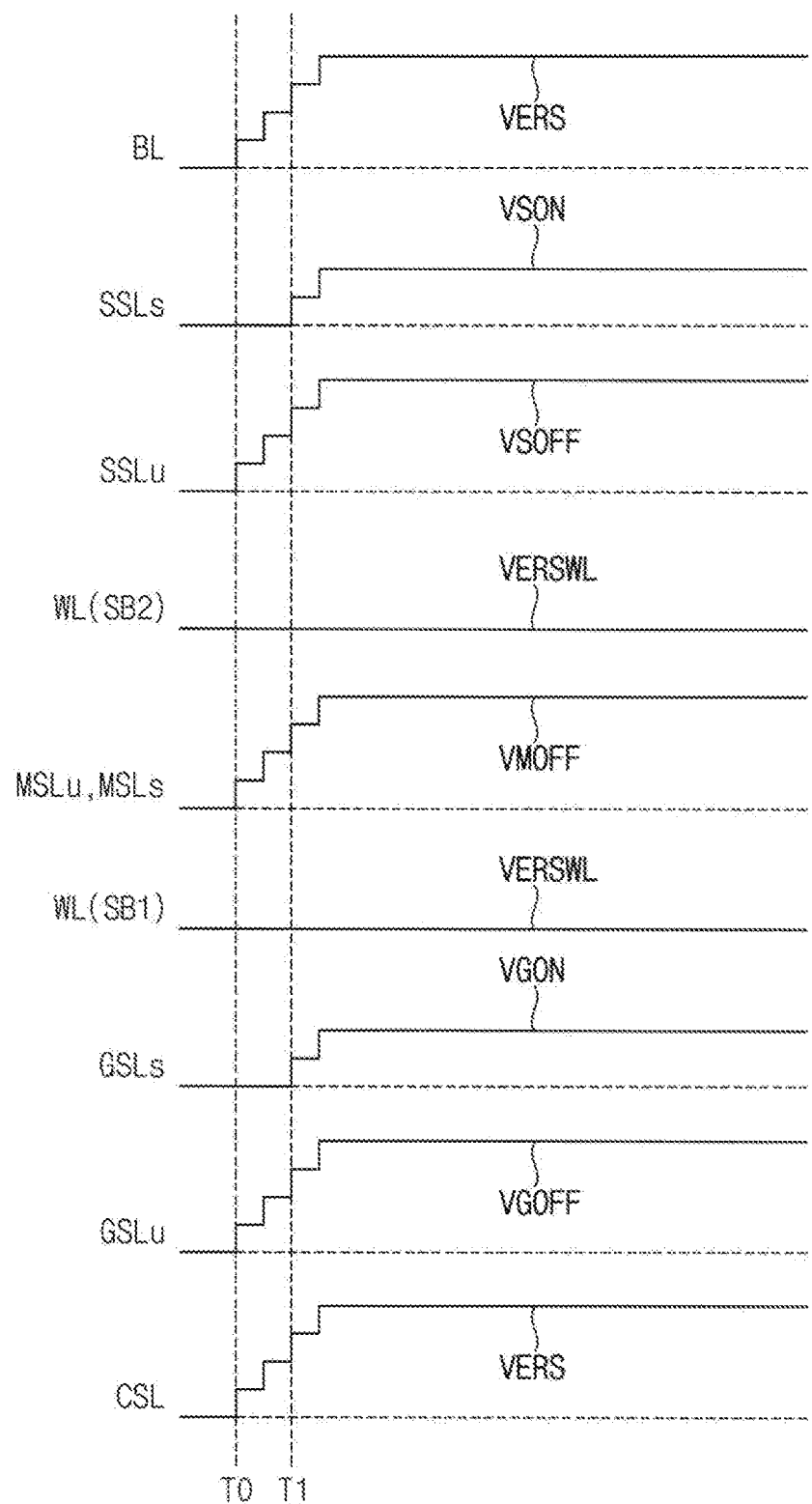

FIGS. 20A and 20B illustrate example embodiments that the erase voltage VERS is applied through both of the common source line CSL and the bit lines BL of the memory block. In FIGS. 20A and 20B, both of the first string group SG1 and the second string group SG2 correspond to selected string groups and the second group segment GRS12 of the first string group SG1 and the first group segment GRS21 of the second string group SG2 may erased simultaneously. The first string selection line SSL1 corresponds to the selected string selection line SSLs and the second string selection line SSL2 corresponds to the unselected string selection line SSLu. In contrast, the first ground selection line GSL1 corresponds to the unselected ground selection line GSLu and the second ground selection line GSL2 corresponds to the selected string selection line GSLs.

When the erase voltage VERS is applied to both of the common source line CSL and the bit line BL of the plurality of cell strings STR1~STR4 and only one of the first group segment and the second group segment of each string group, all of the intermediate switching transistors of the plurality of cell strings STR1~STR4 may be turned off by applying the turn-off voltage VMOFF to all of the intermediate switching lines MSL1 and MSL2.

Referring to the second string group SG2 in FIG. 20A, when erasing only the first group segment GRS21 of the selected string group SG2, the selected ground selection transistor of the selected string group SG2 may be turned on by applying the turn-on voltage VGON to the selected ground selection line GSL2 and the selected string selection transistors of the selected string group SG2 may be turned off by applying the turn-off voltage VSOFF to the selected string selection lines SSL3 and SSL4, while applying the erase voltage VERS to the common source line CSL and the bit line BL.

Referring to the first string group SG1 in FIG. 20A, when erasing only the second group segment GRS12 of the selected string group SG1, the selected ground selection transistor of the selected string group SG1 may be turned off by applying the turn-off voltage VGOFF to the selected ground selection line GSL1 and the selected string selection transistors of the selected string group SG1 may be turned on by applying the turn-on voltage VSON to the selected string selection lines SSL1 and SSL2, while applying the erase voltage VERS to the common source line CSL and the bit line BL.

The unselected ground selection transistors and the unselected string selection transistor of the unselected string group may be turned off always by applying the turn-off voltages VGOFF and VSOFF to the ground selection lines GSL1 and GSL2 and the string selection lines SSL1~SSL4.

Figure 21:
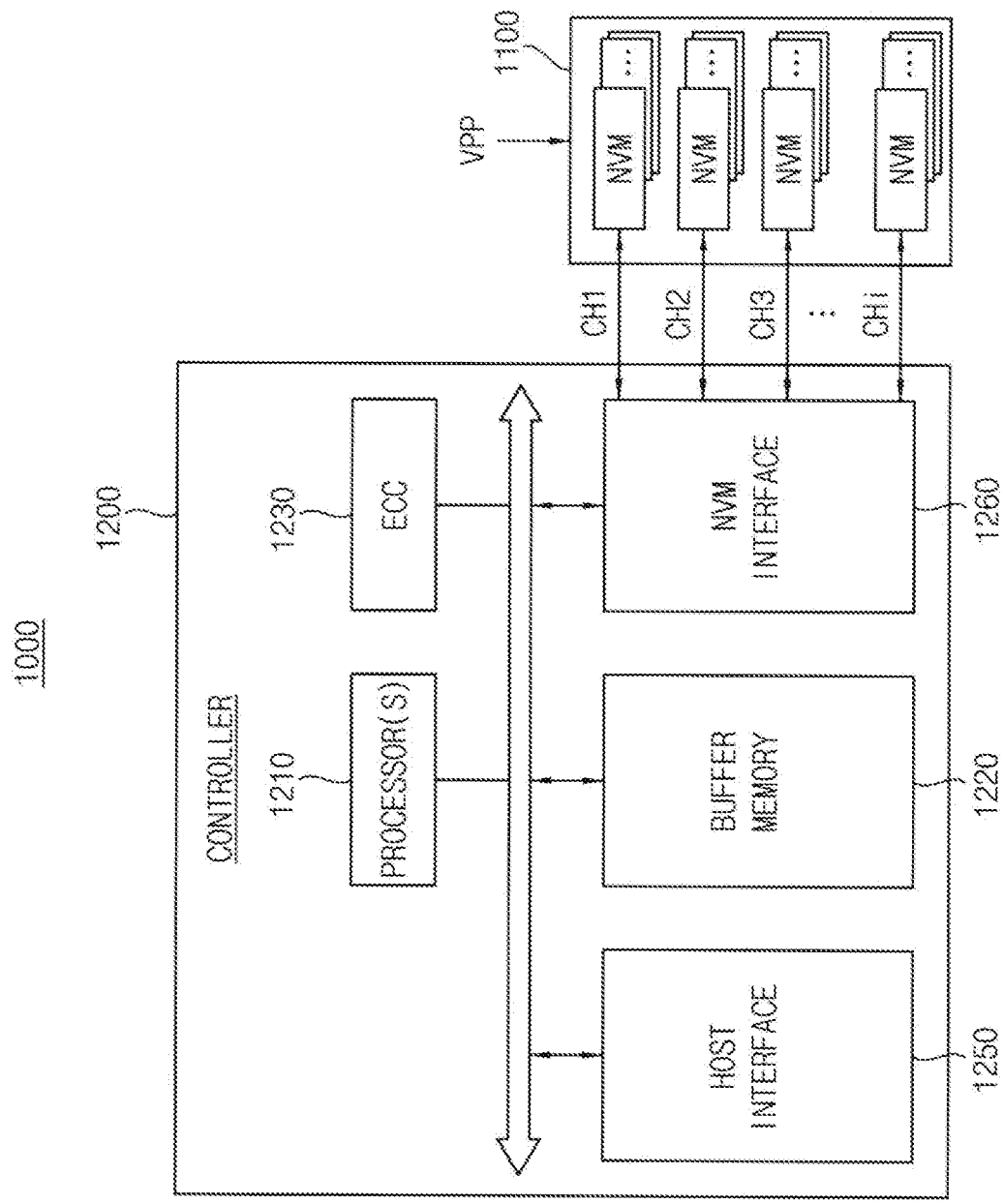
FIG. 21 is a block diagram illustrating a solid state disk or solid state drive (SSD) according to example embodiments.

FIG. 21 is a block diagram illustrating a solid state disk or solid state drive (SSD) according to example embodiments.

Referring to FIG. 21, an SSD 1000 includes nonvolatile memory devices 1100 and an SSD controller 1200.

The nonvolatile memory devices 1100 may be configured optionally to receive a high voltage VPP. The nonvolatile memory devices 1100 may the above-described memory devices according to example embodiments. The nonvolatile memory devices 1100 may reduce the unit capacity of the erase operation through grouping of the cell strings as described above.

The SSD controller 1200 is connected to the nonvolatile memory devices 1100 through multiple channels CH1 to CHi. The SSD controller 1200 includes one or more processors 1210, a buffer memory 1220, an error correction code (ECC) circuit 1230, a host interface 1250, and a nonvolatile memory interface 1260. The buffer memory 1220 stores data used to drive the SSD controller 1200. The buffer memory 1220 comprises multiple memory lines each storing data or a command. The ECC circuit 1230 calculates error correction code values of data to be programmed at a writing operation and corrects an error of read data using an error correction code value at a read operation. In a data recovery operation, The ECC circuit 1230 corrects an error of data recovered from the nonvolatile memory devices 1100.

As described above, the nonvolatile memory device and the method of performing an erase operation according to example embodiments may reduce a size and a number of the spare blocks for storing meta data and thus reduce a size of the nonvolatile memory device by reducing unit capacity of the erase operation through grouping of the cell strings.

In addition, lifetime of the nonvolatile memory device may be extended by suppressing unnecessary erase through grouping of the cell strings.

The present inventive concept may be applied to nonvolatile memory devices and systems including the nonvolatile memory device. For example, the present inventive concept may be applied to systems such as be a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept.

What is claimed is:

1. A method of performing an erase operation in a nonvolatile memory device including a memory block, the memory block including a plurality of cell strings, the plurality of cell strings including a first string group and a second string group, the first string group including a first plurality of memory cells disposed in a vertical direction, the second string group including a second plurality of memory cells disposed in the vertical direction, wherein the first string group is associated with first channels and the second string group is associated with second channels, the method comprising:

forming an erase address corresponding to the first string group; and
    only applying, based on the erase address, an erase voltage to at least a portion of the first channels and not applying the erase voltage to the second channels.

2. The method of claim 1, wherein the only applying, based on the erase address, an erase voltage to at least a portion of the first channels and not applying the erase voltage to the second channels comprises:

applying the erase voltage to a common source line of the plurality of cell strings;
    turning on first ground selection transistors of the first string group while applying the erase voltage to the common source line; and
    turning off second ground selection transistors of the second string group.

3. The method of claim 1, wherein the only applying, based on the erase address, an erase voltage to at least a portion of the first channels and not applying the erase voltage to the second channels comprises:

applying the erase voltage to bit lines of the plurality of cell strings;
    turning on first string selection transistors of the first string group while applying the erase voltage to the bit lines; and
    turning off second string selection transistors of the second string group.

4. The method of claim 1, wherein the only applying, based on the erase address, an erase voltage to at least a portion of the first channels and not applying the erase voltage to the second channels comprises:

applying the erase voltage to a common source line of the plurality of cell strings;
    applying the erase voltage to bit lines of the plurality of cell strings;
    turning on first ground selection transistors of the first string group;
    turning on first string selection transistors of the first string group;
    turning off second ground selection transistors of the second string group; and
    turning off second string selection transistors of the second string group.

5. The method of claim 2, wherein the turning on first ground selection transistors comprises applying a first control signal to first ground selection lines in a gate layer, wherein the gate layer includes first ground selection transistors; and wherein the first ground selection lines are coupled to first gate electrodes of the first ground selection transistors.

6. The method of claim 5, wherein the only applying, based on the erase address, an erase voltage to at least a portion of the first channels and not applying the erase voltage to the second channels comprises:

applying the erase voltage to a common source line of the plurality of cell strings;
    maintaining a first voltage of a first ground selection line corresponding to the first string group at a turn-on voltage lower than a reference voltage, the reference voltage corresponding to the erase voltage minus a threshold voltage of the first ground selection transistors; and
    maintaining a second voltage of a second ground selection line corresponding to the second string group at a turn-off voltage higher than the reference voltage.

7. The method of claim 6, wherein the first ground selection line is floated after a reference delay time is elapsed from a time point when applying the erase voltage to the common source line, and the second ground selection line is floated before the reference delay time is elapsed.

8. The method of claim 6, wherein the turn-on voltage is applied to the first ground selection line as a bias voltage while applying the erase voltage to the common source line, and the turn-off voltage is applied to the second ground selection line as a bias voltage while applying the erase voltage to the common source line.

9. The method of claim 1, wherein the only applying, based on the erase address, an erase voltage to at least a portion of the first channels and not applying the erase voltage to the second channels comprises:applying a turn-on voltage VGON lower than a reference voltage VREF to a first gate electrode of a first ground selection transistor of the first string group, wherein VREF is equal to the erase voltage minus a transistor threshold voltage; and applying a turn-on voltage VGOFF higher than a reference voltage VREF to a second gate electrode of a second ground selection transistor of the second string group.

10. The method of claim 9, wherein the only applying, based on the erase address, an erase voltage to at least a portion of the first channels and not applying the erase voltage to the second channels comprises: applying VGON after applying VGOFF.

11. The method of claim 1, wherein:
    the first string group comprises a plurality of sub blocks disposed in the vertical direction, and
    the memory block includes a plurality of intermediate switching transistors disposed in a boundary layer between the plurality of sub blocks.

12. The method of claim 11, further comprising:
selectively switching the plurality of intermediate switching transistors by units of string groups based on the erase address and an end of the memory block from which the erase voltage is applied; and
selectively erasing one of a first group segment of the first string group under the boundary layer and a second group segment of the first string group over the boundary layer based on the erase address.

13. The method of claim 12, wherein the selectively switching the plurality of intermediate switching transistors comprises:
turning off the intermediate switching transistors of the first string group when the erase voltage is applied to a common source line of the plurality of cell strings and only the first group segment of the first string group is erased; and
turning on the intermediate switching transistors of the first string group when the erase voltage is applied to the common source line and the second group segment of the first string group is erased.

14. The method of claim 12, wherein the selectively switching the plurality of intermediate switching transistors comprises:
turning on the intermediate switching transistors of the first string group when the erase voltage is applied to bit lines of the plurality of cell strings and the first group segment of the first string group is erased; and
turning off the intermediate switching transistors of the first string group when the erase voltage is applied to the bit lines and only the second group segment of the first string group is erased.

15. The method of claim 12, wherein the selectively switching the plurality of intermediate switching transistors comprises turning off all of the intermediate switching transistors of the plurality of cell strings when the erase voltage is applied to a common source line and bit lines of the plurality of cell strings and only one of the first group segment of the first string group and the second group segment of the first string group.

16. The method of claim 15, wherein the only applying, based on the erase address, an erase voltage to at least a portion of the first channels and not applying the erase voltage to the second channels comprises:
when erasing only the first group segment of the first string group:
turning on a first ground selection transistor of the first string group and turning off a second selected string selection transistor of the first string group,
applying a turn-off voltage to an intermediate switching line positioned between the first string group and the second string group, and
applying the erase voltage to the common source line and the bit lines.

17. The method of claim 15, wherein the only applying, based on the erase address, an erase voltage to at least a portion of the first channels and not applying the erase voltage to the second channels comprises:
when erasing only the second group segment of the first string group:
turning off a first ground selection transistor of the first string group and turning on a first string selection transistor of the first string group,
applying a turn-off voltage to an intermediate switching line positioned between the first string group and the second string group, and
applying the erase voltage to the common source line and the bit lines.

18. The method of claim 12, wherein an erase permission voltage is applied to word lines of a selected group segment to be erased among the first and second group segments and an erase inhibition voltage is applied to word lines of an unselected group segment.

19. A nonvolatile memory device comprising:
a memory block including a plurality of cell strings, a plurality of memory cells being disposed in a vertical direction in each of the plurality of cell string, the plurality of cell strings being divided into a plurality of string groups including a first string group comprising first channels and a second string group comprising second channels; and
a control circuit configured to selectively apply an erase voltage to the first channels of the first string group corresponding to an erase address among the plurality of cell strings to erase the first string group while not erasing the second string group.

20. A method of erasing a first portion of a first cell string of a flash memory, wherein the flash memory includes a first cell string and a second cell string, the method comprising:
applying a turnoff voltage, VSOFF, to a first source selection line of the first cell string;
applying VSOFF to a second source selection line of the second cell string;
applying an erase permission voltage, VERSWL, to a first memory cell, wherein the first portion of the first cell string includes the first memory cell;
applying an erase inhibition voltage, VINHWL, to a second memory cell, wherein a second portion of the first cell string includes the second memory cell;
applying a turn-on voltage, VGON, to a first ground selection line associated with the first cell string;
applying a turn-off voltage, VGOFF, to a second ground selection line associated with the second cell string, wherein VGOFF is applied in time before VGON; and
applying an erase voltage, VERS, to a common source line, wherein the common source line is associated with the first cell string and associated with the second cell string, and wherein an effect of VERS is to erase the first memory cell while not erasing the second memory cell.

* * * * *